(12) United States Patent
Chang et al.

(10) Patent No.: US 12,446,228 B2
(45) Date of Patent: Oct. 14, 2025

(54) MEMORY DEVICE AND METHOD FOR FABRICATING THE SAME

(71) Applicant: Taiwan Semiconductor Manufacturing Company, Ltd., Hsinchu (TW)

(72) Inventors: Kuo-Pin Chang, Zhubei (TW); Chien Hung Liu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 356 days.

(21) Appl. No.: 17/725,013

(22) Filed: Apr. 20, 2022

(65) Prior Publication Data

US 2023/0209836 A1    Jun. 29, 2023

Related U.S. Application Data

(60) Provisional application No. 63/294,536, filed on Dec. 29, 2021.

(51) Int. Cl.
*H10B 51/00* (2023.01)
*H10B 51/20* (2023.01)
*H10B 51/30* (2023.01)

(52) U.S. Cl.
CPC ............. *H10B 51/30* (2023.02); *H10B 51/20* (2023.02)

(58) Field of Classification Search
USPC ........................................................ 257/295
See application file for complete search history.

(56) References Cited

U.S. PATENT DOCUMENTS

| | | | |
|---|---|---|---|
| 9,595,346 B2 | 3/2017 | Lee et al. | |
| 10,032,787 B2 | 7/2018 | Shin et al. | |
| 10,658,378 B2 | 5/2020 | Tao et al. | |
| 10,923,193 B2 | 2/2021 | Lee | |
| 10,950,617 B2 | 3/2021 | Takekida | |
| 2013/0201758 A1 | 8/2013 | Kim et al. | |
| 2016/0079185 A1 | 3/2016 | Kato et al. | |
| 2019/0198509 A1 | 6/2019 | Kim | |
| 2020/0105773 A1 | 4/2020 | Morris et al. | |
| 2021/0082955 A1* | 3/2021 | Rajashekhar | H10B 51/10 |

(Continued)

FOREIGN PATENT DOCUMENTS

| | | |
|---|---|---|
| KR | 20180059271 A | 6/2018 |
| WO | 2015179537 A1 | 11/2015 |

*Primary Examiner* — Trang Q Tran
(74) *Attorney, Agent, or Firm* — Eschweiler & Potashnik, LLC

(57) ABSTRACT

A memory device having a 3D structure provides MFMIS-FET memory cells with a high chip area density. The memory device includes a stack of memory cell layers interleaved with insulating layers. Channel vias penetrate through the stack. Channels of the memory cells are disposed in the channel vias. MFM portions of memory cells are sandwiched between the insulating layers in areas lateral to the channel vias. The MFM portions may be radially distributed from the channel vias and include a floating gate, a ferroelectric layer, and a gate electrode. The gate electrodes associated with a plurality of MFM structures may be united into a word line gate. The ferroelectric layer may wrap around the word line gate, whereby the ferroelectric layer is disposed above and below the word line gate as well as between the word line gate and each of the floating gates.

20 Claims, 25 Drawing Sheets

(56) References Cited

U.S. PATENT DOCUMENTS

| | | |
|---|---|---|
| 2021/0343347 A1 | 11/2021 | Yun et al. |
| 2021/0351191 A1 | 11/2021 | Lai et al. |
| 2021/0375937 A1 | 12/2021 | Wu et al. |
| 2022/0020413 A1 | 1/2022 | Tang |
| 2022/0302151 A1* | 9/2022 | Zhang .................. H10B 43/35 |
| 2022/0344365 A1* | 10/2022 | Fujimura ............... H10B 41/10 |

* cited by examiner

MEMORY DEVICE AND METHOD FOR FABRICATING THE SAME

REFERENCE TO RELATED APPLICATION

This application claims the benefit of U.S. Provisional Application No. 63/294,536, filed on Dec. 29, 2021, the contents of which are incorporated herein by reference in their entirety.

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
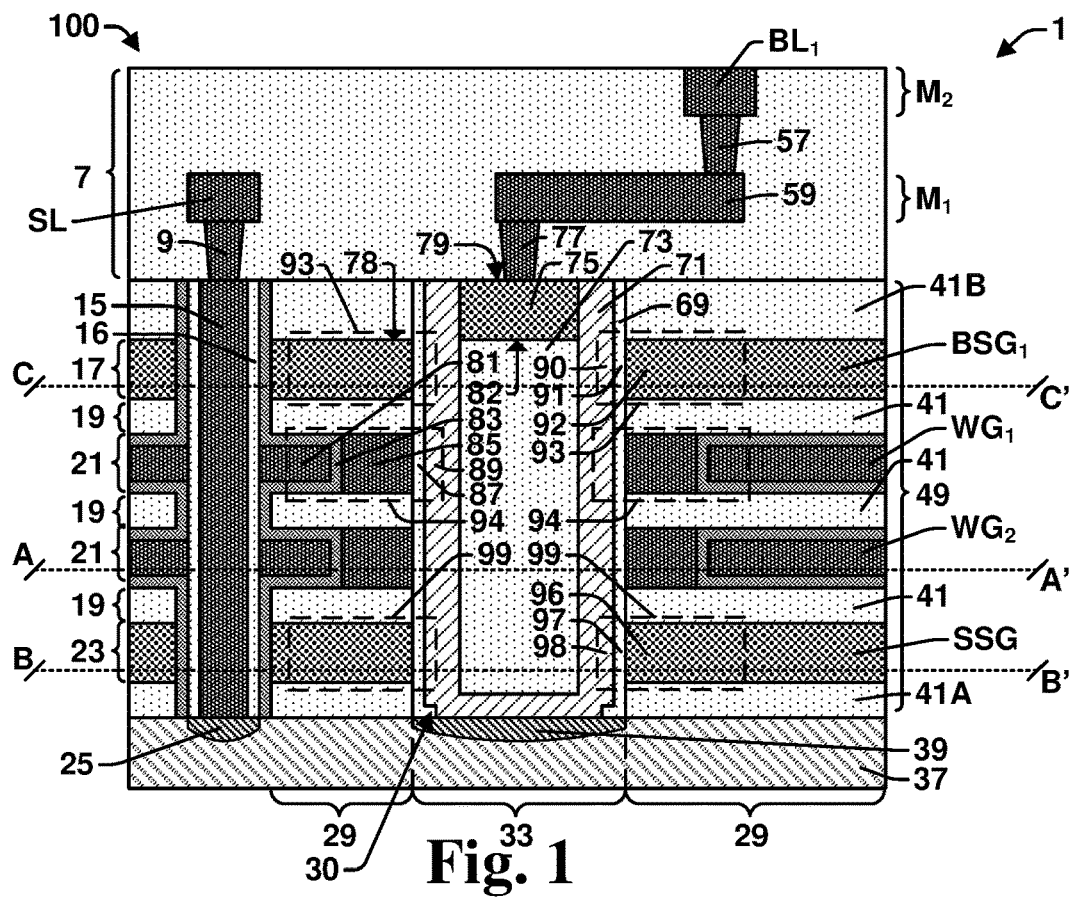
FIG. 1 illustrates a cross-sectional side view of a portion of a memory device in accordance with some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) device according to some aspects of the present disclosure includes ferroelectric random-access memory (FeRAM). FeRAM has a metal/ferroelectric layer/metal (MFM) structure in which a ferroelectric layer is arranged between two conductive layers providing top and bottom electrodes. While the term "MFM" is derived based on the conductors being metal, the usage of the term "MFM" in the art and in this application encompasses cases where one or both electrodes are non-metal conductors. FeRAM stores data through a reversible process of switching between polarization states. The polarization states may be altered using an electric field that changes a polarization maintained by the ferroelectric layer's crystal structure. For example, a negative voltage bias applied to a ferroelectric layer may induce atoms to shift into a first orientation, which has a first resistance indicating a first data value (e.g., a logical '1'), whereas a positive voltage bias applied to the ferroelectric layer may induce atoms to shift into a second orientation, which has a second resistance indicating a second data value (e.g., a logical '0').

One type of FeRAM has MFM structures coupled to a drain of a metal-oxide-semiconductor field-effect transistor (MOSFET or FET). Another type of FeRAM is a metal-ferroelectric-insulator-semiconductor field-effect transistor (MFIS-FET or FeFET), which is essentially a metal gate FET with a ferroelectric layer between the oxide and the gate. A third type of FeRAM is a metal-ferroelectric-metalinsulator-semiconductor field-effect transistor (MFMIS-FET) in which the bottom electrode of an MFM structure is coupled to the gate electrode of an FET. The FET gate electrode and the bottom electrode of the MFM structure function as a single floating gate. A MFMIS-FET has advantages such as non-destructive read, low write voltage, and high endurance.

One aspect of the present disclosure is a memory device having a 3D structure that provides MFMIS-FET memory cells with a high chip area density. The memory device includes memory cell layers interleaved with isolation layers in a stack over the substrate. MFMIS memory cells including gate electrodes, ferroelectric layers, floating gates, tunnel dielectrics, and channels are in the memory cell layers. Semiconductor structures that extend vertically through the memory cell layers and the isolation layers provide the channels. MFM structures that include the gate electrodes, the ferroelectric layers, and the floating gates are lateral to the channels and are sandwiched between dielectrics of the isolation layers. The floating gates, the ferroelectric layers, and the gate electrodes are radially distributed around the channels with the floating gates being closest, the gate electrode being furthest, and at least a portion of the ferroelectric layer disposed between the two. The tunnel dielectrics are between the floating gates and the channels.

The gate electrodes associated with a plurality of MFM structures may be united into a single conductive structure (a word line gate) that is coupled to a word line. In some embodiments, the ferroelectric layer wraps around the word line gate, whereby the ferroelectric layer is disposed above and below the word line gate as well as between the word line gate and each of the floating gates. In some embodiments, the word line gates extend from sidewalls of the stack. In some embodiments the ferroelectric layers also extend from sidewalls of the stack. In some embodiments, the floating gates encircle the channels.

The channels of the memory cells are oriented vertically. In some embodiments, the channels have an annular cross-section. The semiconductor structures that provide the channels extend vertically through the stack. The channels for a column of horizontally aligned memory cells are connected in series through one of the semiconductor structures. The semiconductor structure couples at one end to a bit line and at an opposite end to a source line.

A bit line coupling transistor may be interposed between the column of memory cells and a bit line connection for those memory cells. In some embodiments, the semiconductor structure provides a channel for the bit line coupling transistor and that channel is connected in series with the channels of the memory cells in the column. A gate electrode for the bit line coupling transistor may be provided by an additional layer added to the memory cell layer/insulating layer stack. In some embodiments, the gate electrode for the bit line coupling transistor is polysilicon or the like. In some embodiments, the gate electrode for the bit line coupling transistor has the same structure as the memory cell layers. For example, the gate electrode for the bit line coupling transistor may have the MFM structure. Although the bit line coupling transistor may have the structure of a memory cell, it is not subject to program and erase operations. The memory device may be without circuitry that is operative to perform program and erase operations on the bit line coupling transistor.

The gate electrodes for groups of bit line coupling transistors are united to form a single bit line-connection select gate (BSG). The BSGs are operative to select a sector of memory cells. Columns of memory cells in the sector couple to distinct bit lines. The bit lines may extend to connect with a plurality of memory cell columns in a plurality of sectors. The bit line connections in each sector are toggled by a BSG. Using the BSGs to select a particular sector, the bit lines to select a particular column within the sector, and the word lines to select a particular tier within the column, any memory cell in the array may be individually addressed.

A source line coupling transistor may be interposed between each column of memory cells and a source line connection for those memory cells. In some embodiments, the semiconductor structure provides a channel for the source line coupling transistor and that channel is connected in series with the channels of the memory cells in the column. A gate electrode for the source line coupling transistor may be provided by an additional layer of the memory cell layer/insulating layer stack. In some embodiments, the source line-connection select gate is underneath the memory cell layer/insulating layer stack. In some embodiments, a bit line-connection select gate is above the memory cell layer/insulating layer stack. In some embodiments, the gate electrode for the source line coupling transistor is polysilicon or the like. In some embodiments, the gate electrode for the source line coupling transistor has the same structure as the memory cell layers. For example, the gate electrode for the source line coupling transistor may have the MFM structure. Although the source line coupling transistor may have the structure of a memory cell, it is not subject to program and erase operations. The memory device may be without circuitry that is operative to perform program and erase operations on the source line coupling transistor.

The gate electrodes for groups of source line coupling transistors are united to form a single source line-connection select gate (SSG). The SSGs are operative to toggle a source line connection for a sector of memory cells. In some embodiments, the source line connection includes a source line via that extends vertically adjacent the stack and is separated from the stack by a dielectric layer. In some embodiments, the source line via is in the shape of a slab. The source line via may communicate with the source line select transistor through the substrate. The semiconductor structure may contact a first doped area of the substrate. The source line via may contact a second doped area of the substrate.

Although the memory device has thus far been described as having MFMIS-FET memory cells, it will be appreciated that the embodiments may be modified to implement other memory types by replacing the ferroelectric layer with one or more other layers that provide a different type of data storage structure. For example, the memory device could be resistive random access memory (ReRAM), phase change memory (PCRAM), magneto-resistive random-access memory (MRAM), or the like.

Some aspects of the present disclosure relate to a method of manufacturing a memory device. The method includes forming a stack having alternating insulating layers and sacrificial layers. In some embodiments, the insulating layers are an oxide and the sacrificial layers are a nitride. First holes are etched through the stack and a first portion of each sacrificial layer is etched away through the first holes to create first voids. At least a conductive material that provides the floating gates is deposited to fill the first voids. A tunnel dielectric layer is formed in the first holes then a channel layer is deposited in the first holes. Trenches are etched through the stack and a remaining portion of each sacrificial layer is etched away through the trenches to create second voids. A data storage layer is deposited in the trenches as is a conductive material that provides the gate electrodes. In some embodiments, the data storage layer is a ferroelectric layer.

In some embodiments, the stack includes a first conductive layer above the highest sacrificial layer and separated from it by an insulating layer. In some embodiments, the stack includes a second conductive layer below the lowest sacrificial layer and separated from it by another insulating layer. In some embodiments, the conductive layers are polysilicon. In some embodiments, the first conductive layer provides a BSG. In some embodiments, the second layer provides an SSG.

In some embodiments, the stack is formed over a semiconductor substrate. In some embodiments, the first openings are formed directly over a heavily doped area of the semiconductor substrate. In some embodiment, the tunnel dielectric deposits at the bottoms of the first openings and is etched through prior to depositing the semiconductor layer in order to allow the semiconductor layer to contact the heavily doped area. In some embodiments, both the semiconductor layer and the tunnel dielectric layer are etched through at the bottoms of the openings followed by deposition of a second semiconductor layer to bring the channels into contact with the heavily doped area. In some embodiments, the semiconductor substrate is extended by epitaxial growth from the bottoms of the first openings and the epitaxial growth provides the heavily doped area.

FIG. 1 provides a cross-sectional view 100 that illustrates a portion of a memory device 1 having a 3D structure according to some embodiments of the present disclosure. The memory device 1 has a stack 49 that includes memory cell layers 21 interleaved with isolation layers 19. A channel via 79 penetrates vertically through the stack 49 and intersects memory cell layers 21 in via area 33. The isolation layers 19 comprise dielectric layers 41. The dielectric layers 41 are in a stack area 29 that surrounds the via area 33. The dielectric layers 41 are intact above and below the memory cell layers 21 within the stack area 29 but have holes in the via area 33. Memory cells 94 are formed in each of the memory cell layers 21.

Figure 2:
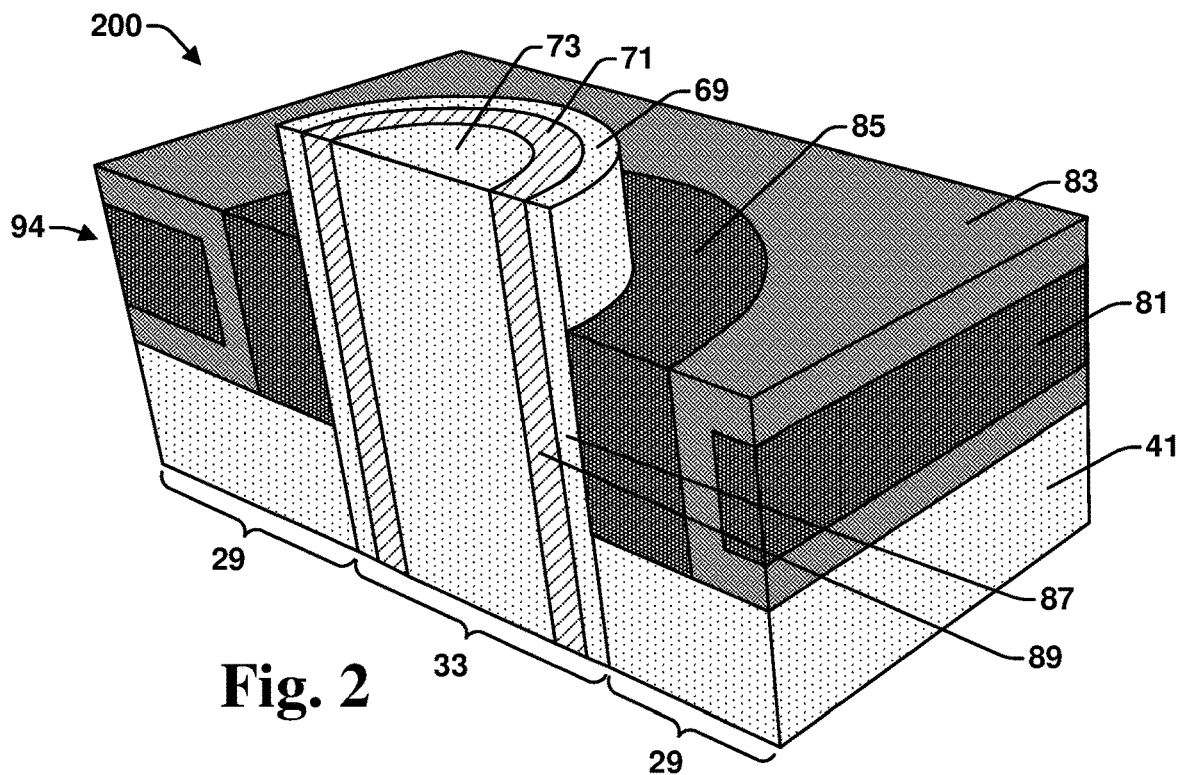
FIG. 2 illustrates a cutaway perspective view 200 of some embodiments of a memory cell in the memory device of FIG. 1.

FIG. 2 provides a cutaway perspective view 200 illustrating one of the memory cells 94. Each memory cell 94 includes a channel 89, a tunnel dielectric 87, a floating gate 85, a data storage layer 83, and a gate electrode 81. The channels 89 are in the via area 33. In some embodiments, the tunnel dielectrics 87 are also in the via area 33. The channel via 79 comprises a semiconductor layer 71 that provide the channels 89, a tunnel dielectric layer 69 that provides the tunnel dielectrics 87, and dielectric 73.

In some embodiment, the memory cell layers 21 have a thickness in the range from about 100 Å to about 1600 Å. In some embodiment, the memory cell layers 21 have a thickness in the range from about 200 Å to about 800 Å. If the memory cell layers 21 are too thin the coupling ratio (gate to channel) may be too low. If the memory cell layers 21 are too thick, device density may be unduly compromised. The thickness of the memory cell layers 21 may be selected to achieve a target coupling ratio. The target coupling ratio may be from about 0.3 to about 1.0.

In some embodiment, the dielectric layers 41 have a thickness in the range from about 200 Å to about 800 Å. In some embodiments, the dielectric layers 41 have a thickness in the range from about 100 Å to about 400 Å. If the dielectric layers 41 are too thin, excessive current leakage may occur. If the dielectric layers 41 are too thick, there may be insufficient control over conduction though the semiconductor layer 71.

The floating gates 85, the data storage layers 83, and the gate electrodes 81 are disposed in the stack area 29. In some embodiments, the floating gates 85 border the channel via 79. In some embodiments, the data storage layers 83 wrap around the gate electrodes 81. In some embodiments, the gate electrodes 81 and the floating gates 85 are metal. In some embodiments, the data storage layer 83 is a ferroelectric layer. The data storage layer 83 may comprise a plurality of layers that provide a data storage function. The gate electrodes 81 are parts of larger structures: word line gates $WG_1$ and $WG_2$ each of which surrounds a plurality of the channel vias 79.

Figure 3:
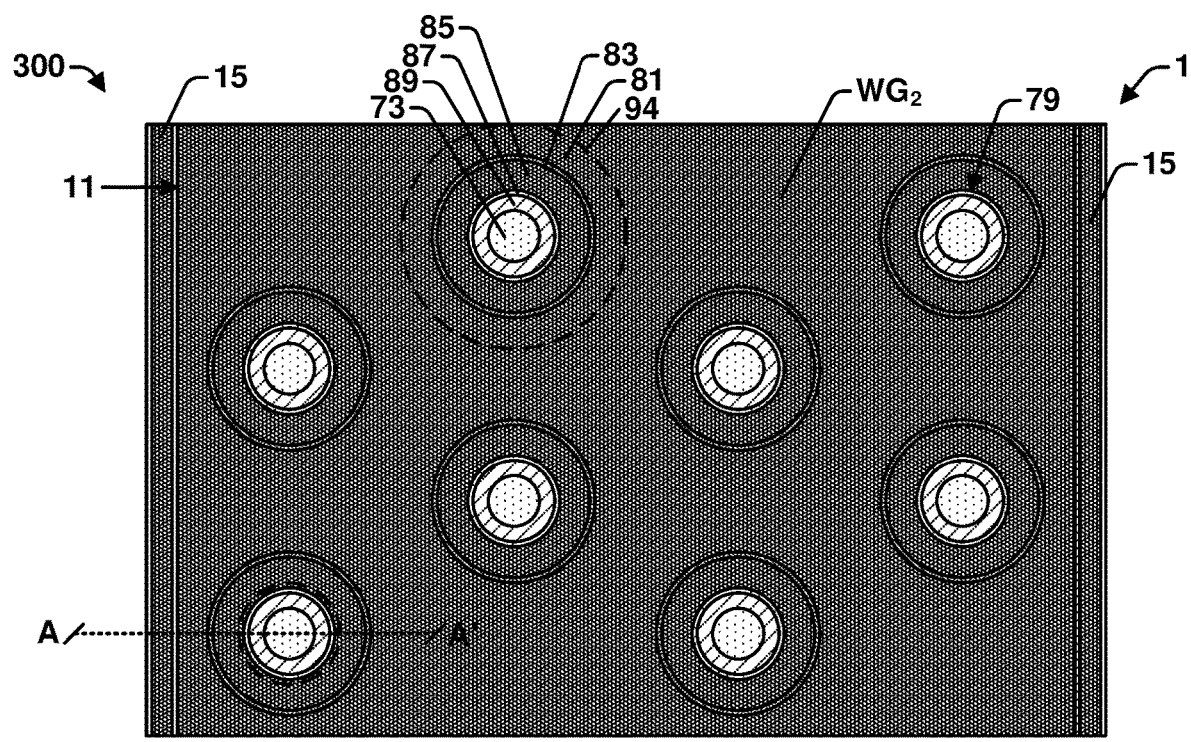
FIG. 3 illustrates a horizontal cross-section of some embodiments of the memory device of FIG. 1 taken through a memory cell layer.

FIG. 3 provides a cross-sectional view 300 taken through one of the memory cell layers 21 of the memory device 1. The line A-A' in FIG. 3 corresponds with the line A-A' in FIG. 1. As can be seen by comparing the line A-A' between these two figures, the cross-sectional view 300 encompasses a greater area of the memory device 1 than the area illustrated by the cross-sectional view 100. Whereas FIG. 1 shows a single channel via 79, FIG. 3 shows a plurality of channel vias 79 corresponding to a sector of the memory device 1. As illustrated in FIG. 3, the memory cells 94 have radial symmetry. Each of the channel 89, the tunnel dielectric 87, the floating gate 85, and the data storage layer 83 have annular cross-sections. The gate electrodes 81 occupy annular spaces but are part of a larger word line gate $WG_2$ that provides gate electrodes 81 for a group of memory cells 94 within one layer of the memory device 1. Having the floating gates encircling the channels provides a gate-all-around structure that results in superior gate control. The annular cross-sections and the gate-all-around structure provide a uniform polarization property and reduce threshold voltage variations among memory cells.

Figure 4A:
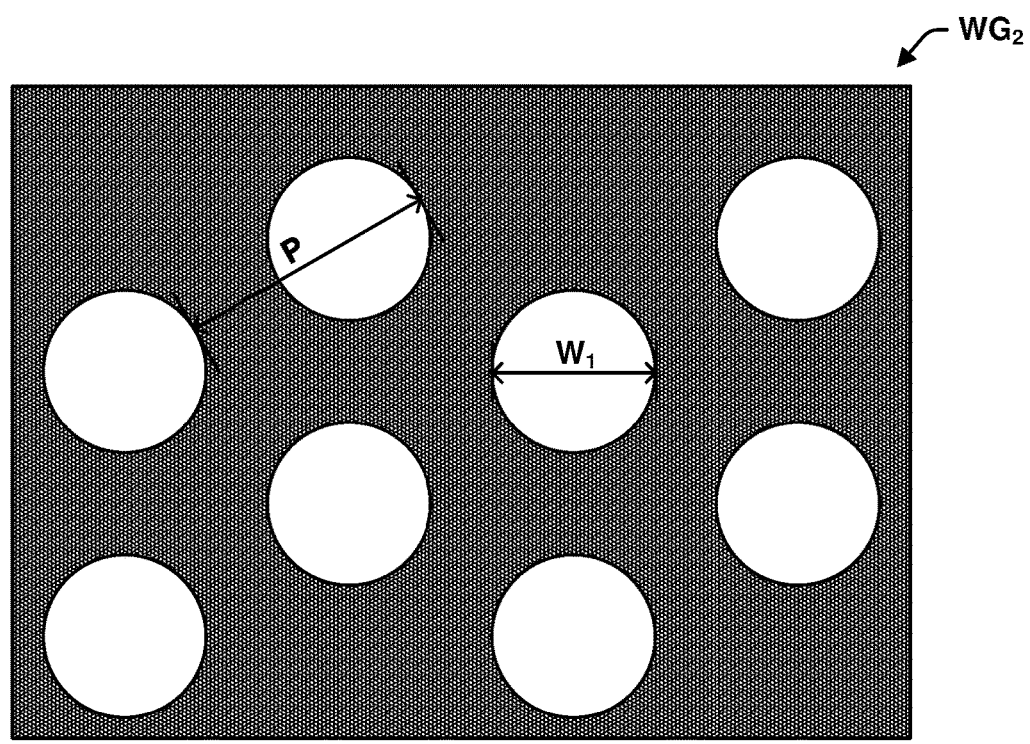
FIG. 4A illustrates a plan view of some embodiments of a word line gate for the memory device of FIG. 1.
Figure 4B:
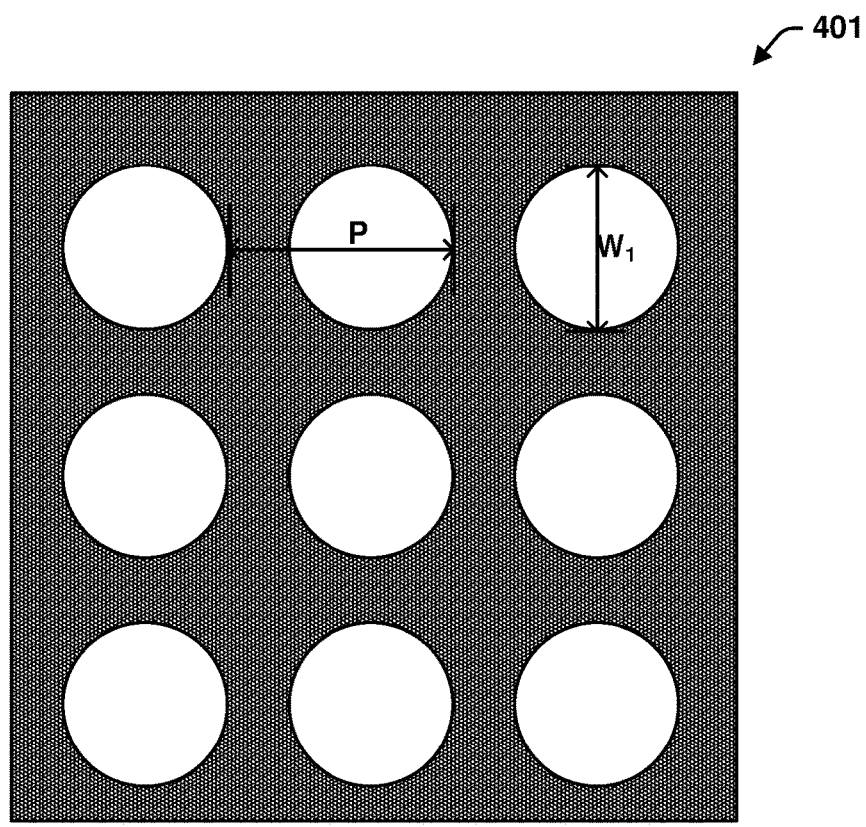
FIG. 4B illustrates a plan view of a word line gate for some other embodiments of the present disclosure.

The word line gate $WG_2$ is shown separately in FIG. 4A. As can be seen from FIGS. 3 and 4A, the memory cells 94 may be arranged in staggered rows. FIG. 4A shows the word line gate $WG_2$ for the case in which each sector has four rows with two memory cells per row. There can be a greater or lesser number of rows and there can be a greater number of memory cells per row. In some embodiments, there are from 2 to 12 rows. A greater number of rows may result in processing difficulties. FIG. 4B shows a word line gate 401 for an alternative embodiment in which the memory cells 94 in each sector are arranged in the non-staggered rows with three memory cells per row. Some of the channel vias 79 in the pattern may be replaced with dummy vias (not shown) to provide additional stack sidewalls that facilitate manufacturing according to a process described below. Dummy vias are particularly useful when the memory device 1 has many more cells per tier per sector than shown in the illustrated examples.

Referring again to FIG. 1, a bit line coupling transistor 93 is formed in an upper layer 17 of the stack 49. The upper layer 17 is disposed above the memory cell layers 21 and is separated from an adjacent memory cell layer 21 by an isolation layer 19. The bit line coupling transistor 93 includes a channel 90, a tunnel dielectric 91, and a gate electrode 92. The channel 90 is provided by the semiconductor layer 71. The tunnel dielectric 91 is provided by the tunnel dielectric layer 69. The gate electrode 92 is part of a bit line-connection select gate $BSG_1$ that provides the gate electrodes 92 for each of the bit line coupling transistors 93 in one sector of the memory device 1. In some embodiments, the bit line-connection select gate $BSG_1$ is polysilicon.

A conductive plug 75 at the top of the channel via 79 is in contact with the semiconductor layer 71. A bottom surface 82 of the conductive plug 75 is coplanar with an upper surface 78 of the gate electrode 92. Alternatively, the bottom surface 82 may be slightly above the upper surface 78 of the gate electrode 92. Through the conductive plug 75, the bit line coupling transistor 93 is coupled to a bit line $BL_1$ that is in a metal interconnect 7 above the stack 49. The connection may include additional structures within the metal interconnect 7 such as the via 77, the wire 59 and the via 57.

A source line coupling transistor 99 is formed in a lower layer 23 of the stack 49. The lower layer 23 is disposed below the memory cell layers 21 and is separated from an adjacent memory cell layer 21 by an isolation layer 19. The source line coupling transistor 99 includes a channel 98, a tunnel dielectric 97, and a gate electrode 96. The channel 98 is provided by the semiconductor layer 71. The tunnel dielectric 97 may be provided by the tunnel dielectric layer 69. The gate electrode 96 is part of a source line-connection select gate SSG that provides the gate electrodes 96 for each of the source line coupling transistors 99 in one sector of the memory device 1. In some embodiments, the source line-connection select gate SSG is polysilicon.

Figure 5A:
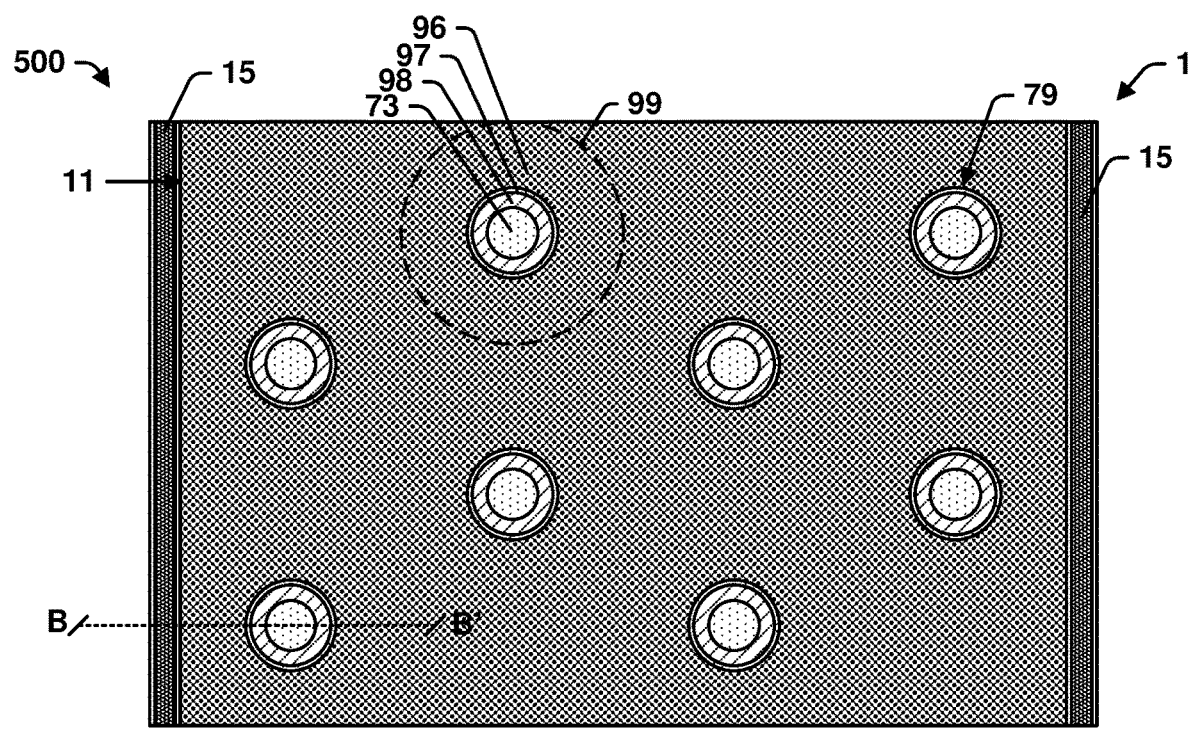
FIG. 5A illustrates a horizontal cross-section of some embodiments of the memory device of FIG. 1 taken through a bit line-connection select gate layer.

FIG. 5A provides a cross-sectional view 500 that shows the same area of the memory device 1 as shown by the cross-section view 300 of FIG. 3 but is taken through the lower layer 23. The line B-B' in FIG. 5A corresponds with the line B-B' in FIG. 1. As illustrated in FIG. 5A, the source line coupling transistors 99 have radial symmetry. The channel 98 and the tunnel dielectric 97 are annular. The gate electrode 96 occupies an annular space but is part of the source line-connection select gate SSG that provides gate electrodes 96 for a group of source line coupling transistors 99.

Figure 5B:
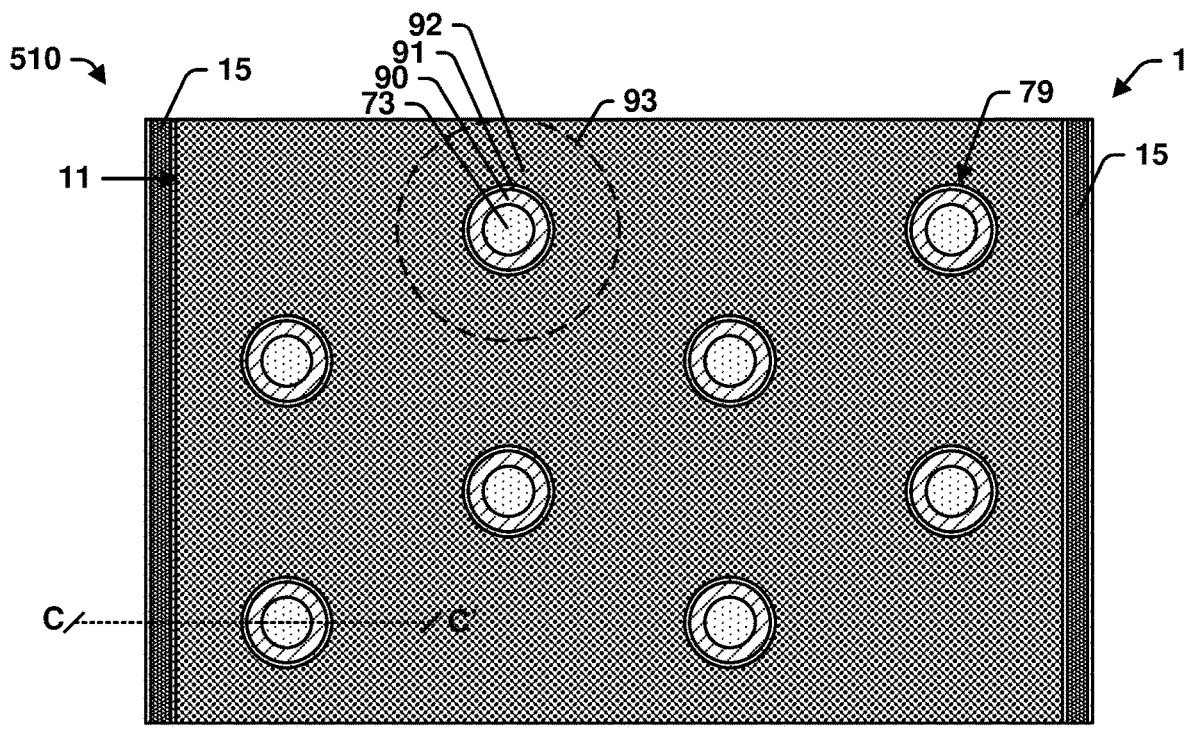
FIG. 5B illustrates a horizontal cross-section of some embodiments of the memory device of FIG. 1 taken through a source line-connection select gate layer.

FIG. 5B provides a cross-sectional view 510 that shows the same area of the memory device 1 as shown by the cross-section views 300 and 500 of FIGS. 3 and 5A, but is taken through the upper layer 17. The line C-C' in FIG. 5B corresponds with the line C-C' in FIG. 1. As illustrated in FIG. 5B, the bit line coupling transistors 93 have radial symmetry. The channel 90 and the tunnel dielectric 91 are annular. The gate electrode 92 occupies an annular space but is part of the bit line-connection select gate BSG that provides gate electrodes 92 for a group of bit line coupling transistors 93.

Referring again to FIG. 1, the stack 49 is on a semiconductor substrate 37. A conductive slab 15, which is also on the semiconductor substrate 37, is disposed to one side of the stack 49 and is separated from the stack 49 by a dielectric layer 16. The conductive slab 15 may have the same height as the stack 49. A top of the conductive slab 15 is connected to the source line SL through a via 9 in the metal interconnect 7.

The semiconductor layer 71 is in direct contact with the first heavily doped area 39 of the semiconductor substrate 37. In some embodiments, an epitaxial growth (not shown) into the channel via 79 from the substrate 38 provides a first heavily doped area 39. The conductive slab 15 is in contact with a second heavily doped area 25 of the semiconductor substrate 37. The first heavily doped area 39 and the second heavily doped area 25 have a same doping type. A bulk of the semiconductor substrate 37 may be lightly doped with the same doping type. Charge carriers may move between the source line SL and the semiconductor layer 71 through the semiconductor substrate 37 and the conductive slab 15 when the source line coupling transistor 99 is switched on.

Figure 6:
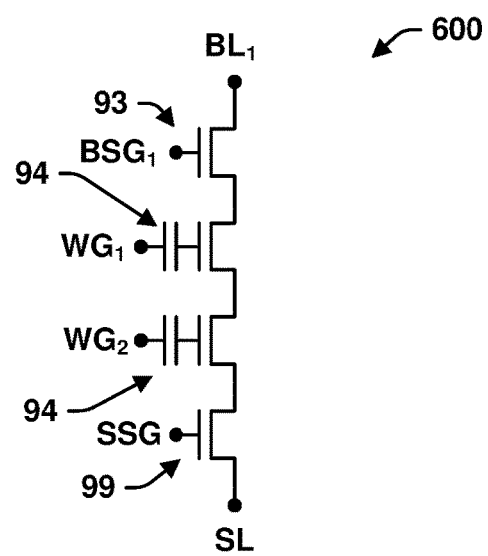
FIG. 6 is an equivalent circuit diagram for some embodiments of the portion of the memory device illustrated in FIG. 1.

FIG. 6 provides an equivalent circuit diagram 600 for the portion of the memory device 1 that is shown in FIG. 1. As shown by the equivalent circuit diagram 600, the source line coupling transistor 99, the two memory cells 94, and the bit line coupling transistor 93 are connected in series between source line SL and bit line $BL_1$. The number of memory cells 94 in the equivalent circuit diagram 600 equals the number of memory cell layers 21. Although there are only two in the illustrated example, it will be appreciated that larger numbers of memory cell layers may be used. The source line coupling transistor 99 is switched by the source line-connection select gate SSG. The bit line coupling transistor 93 is switched by the bit line-connection select gate $BSG_1$. The memory cells 94 are switched by word gate $WG_1$ and word gate $WG_2$. In a first programing state, the memory cells 94 have a lower threshold voltage for switching. In a second programing state, the memory cells 94 have a higher threshold voltage for switching. Using an intermediate voltage on one of the word gates and a voltage above the higher threshold on all the other word gates, the programming state of a particular memory cell 94 may be queried.

Figure 7:
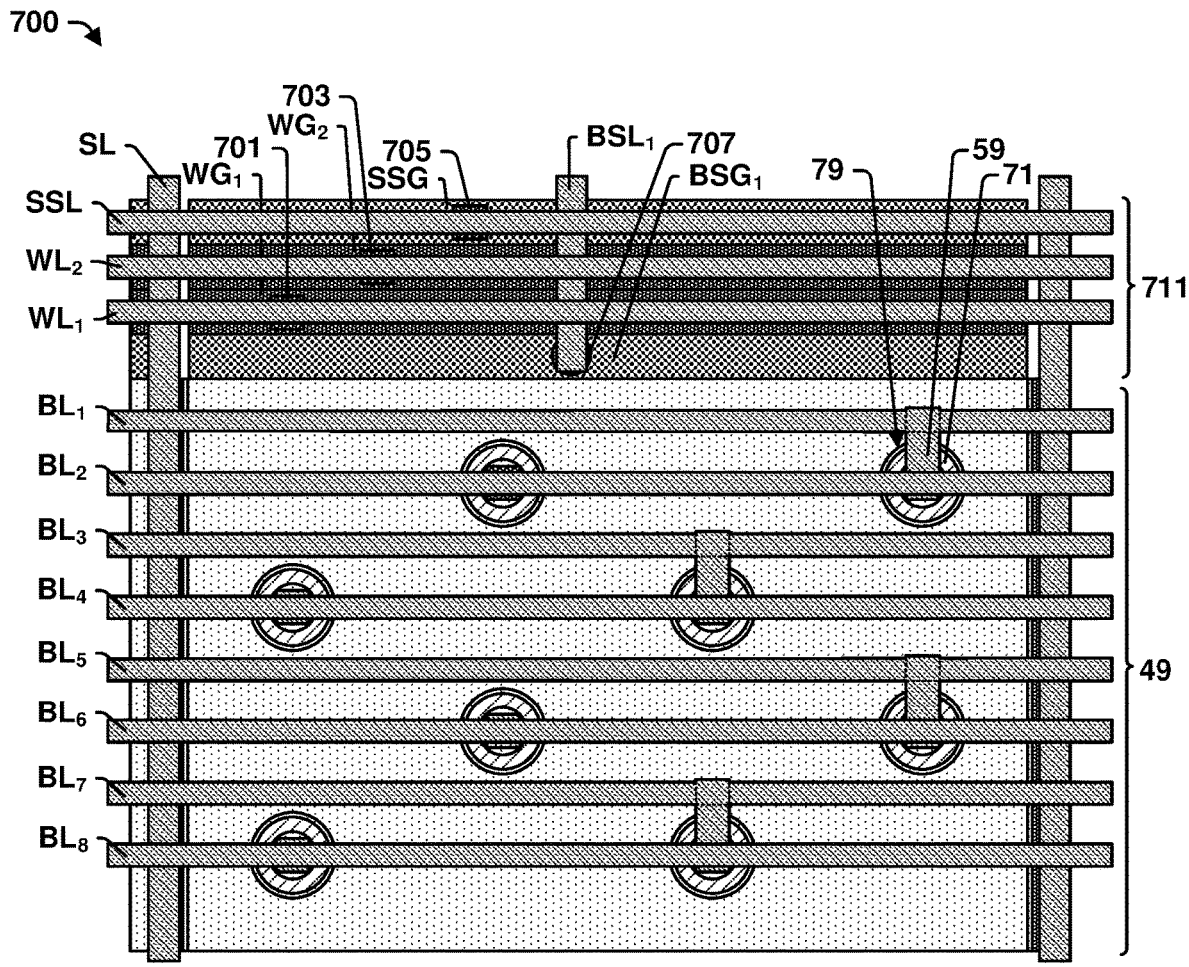
FIG. 7 illustrates a top view of some embodiments of a sector of the memory device of FIG. 1.
Figure 8:
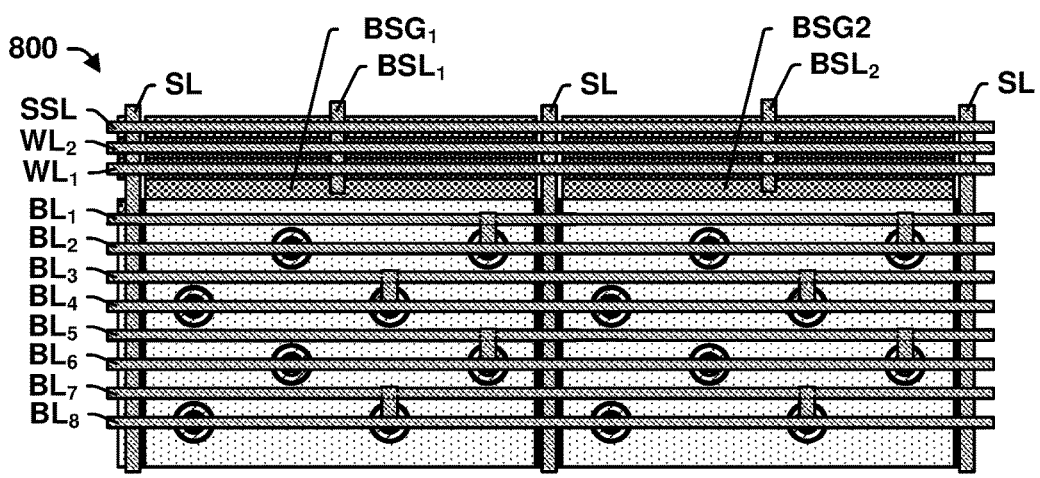
FIG. 8 illustrates a top view of some embodiments of two sectors of the memory device of FIG. 1.
Figure 9:
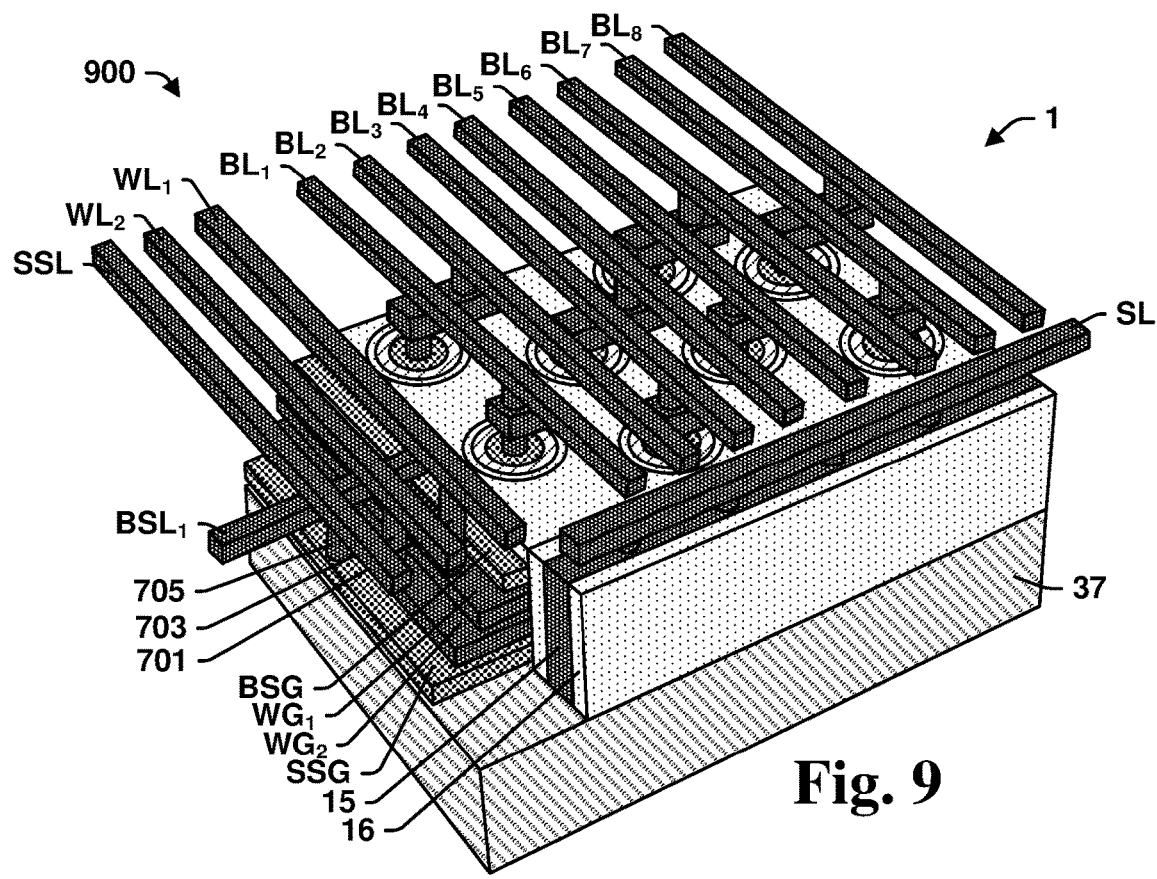
FIG. 9 illustrates a perspective view of some embodiments of a sector of the memory device of FIG. 1.

FIGS. 7 and 8 illustrate top views 700 and 800 of the memory device 1. The view 700 of FIG. 7 encompasses one sector of the memory device 1 and the view 800 of FIG. 8 encompasses two sectors. FIG. 9 is a perspective view 900 of one sector of the memory device 1. As shown by the views 700-900, the bit line-connection select gates $BSG_1$ and $BSG_2$, the word gate electrodes $WG_1$ and $WG_2$, and the source line-connection select gates SSG extend to one side of the stack 49 in varying lengths to form a staircase pattern 711. The staircase pattern 711 provides access for a via 707 to couple the bit line-connection select gate $BSG_1$ with a bit line-connection select line $BSL_1$, a via 701 to couple the word gate electrode $WG_1$ with a word line $WL_1$, a via 703 to couple the word gate electrode $WG_2$ with a word line $WL_2$, and a via 705 to couple the source line-connection select gate SSG with a source line-connection select line SSL.

Bit lines $BL_1$ to $BL_8$ extend in parallel across the top of the stack 49. Each of the bit lines $BL_1$ to $BL_8$ is coupled to the semiconductor layer 71 of a distinct channel via 79. The even numbered bit lines $BL_2$ to $BL_8$ are directly over their respective channel vias 79. The odd numbered bit lines $BL_1$ to $BL_7$ are laterally displaced from their respective channel vias 79. The source line-connection select line SSL and the word lines $WL_1$ and $WL_2$ may be parallel to the bit lines $BL_1$ to $BL_8$.

The bit line-connection select lines $BSL_1$ and $BSL_2$ are coupled to bit line-connection select gates $BSG_1$ and $BSG_2$ respectively (see FIG. 8). The couplings may include wires 59 in metallization layer M1 (see FIG. 1). The bit line-connection select lines $BSL_1$ and $BSL_2$ are perpendicular to the bit lines $BL_1$ to $BL_8$ and may be in a different metallization layer from the bit lines $BL_1$ to $BL_8$. For example, the bit line-connection select lines $BSL_1$ and $BSL_2$ may be in the metallization layer M1 while the bit lines $BL_1$ to $BL_8$ are in the metallization layer M2 (see FIG. 1). Although not shown in the figures, the bit line-connection select lines $BSL_1$ and $BSL_2$ may extend past the bit lines $BL_1$ to $BL_8$ to make connections with additional sectors served by additional bit lines.

Figure 10:
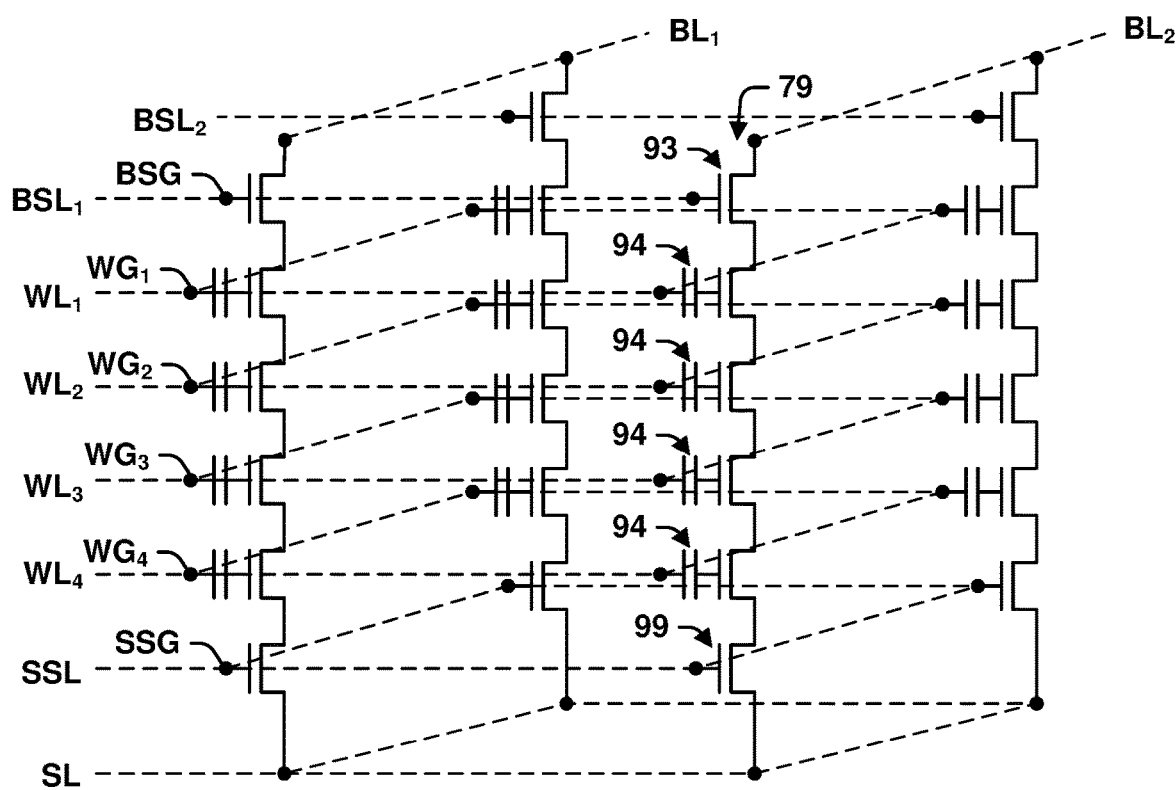
FIG. 10 provides an equivalent circuit diagram for some embodiments of a memory device that is similar to the memory device of FIG. 1.

FIG. 10 provides an equivalent circuit diagram for a memory device that is like the memory device 1 but has four tiers or memory cells 94. The columns correspond to channel vias 79. Any individual column may be selected by choosing one of the bit line-connection select lines $BSL_1$ and $BSL_2$ and one of the bit lines $BL_1$ and $BL_2$. Any individual memory cell in the column may be addressed by applying suitable voltages to the word lines $WL_1$, $WL_2$, $WL_3$, and $WL_4$. All the source line-connection select gates SSG in the memory device may be coupled to one source line-connection select line SSL. The SSL may be used to turn on the source line coupling transistors 99 (see FIG. 1) for read operations and to turn off the source line coupling transistors 99 for write and erase operations.

Figure 11A:
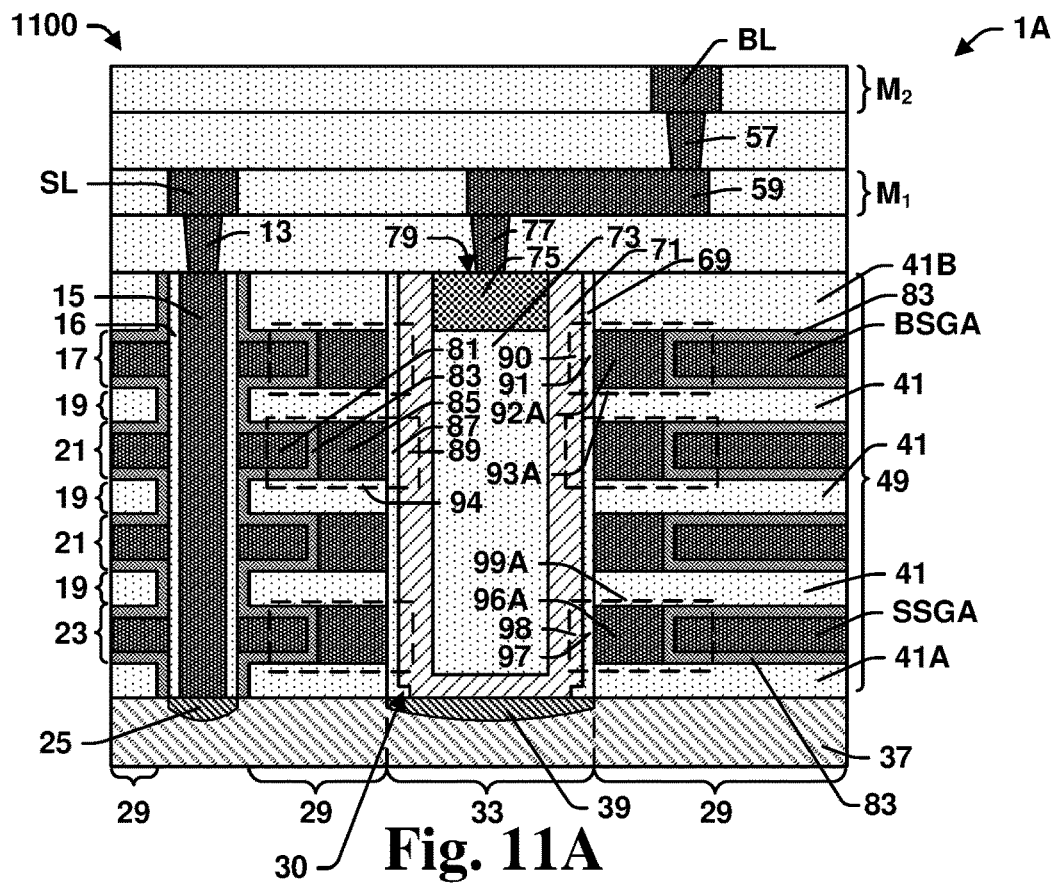
FIG. 11A illustrates a cross-sectional side view of a portion of a memory device in accordance with some other embodiments of the present disclosure.

FIG. 11A is a cross-sectional view 1100 that illustrates a memory device 1A that is like the memory device 1 but has a source line-connection select gate SSGA in place of the source line-connection select gate SSG and a bit line-connection select gate BSGA in place of the bit line-connection select gate $BSG_1$. The source line-connection select gate SSGA and the bit line-connection select gate BSGA each have the structure of a memory cell layer 21 including the data storage layer 83. The gate electrode 96A of the source line coupling transistors 99A and the gate electrode 92A of the bit line coupling transistor 93A are floating gates. The source line-connection select gate SSGA and the bit line-connection select gate BSGA may have slightly higher turn-on voltages than the source line-connection select gate SSG and the bit line-connection select gate $BSG_1$, but otherwise the memory device 1A may operate identically to the memory device 1.

Figure 11B:
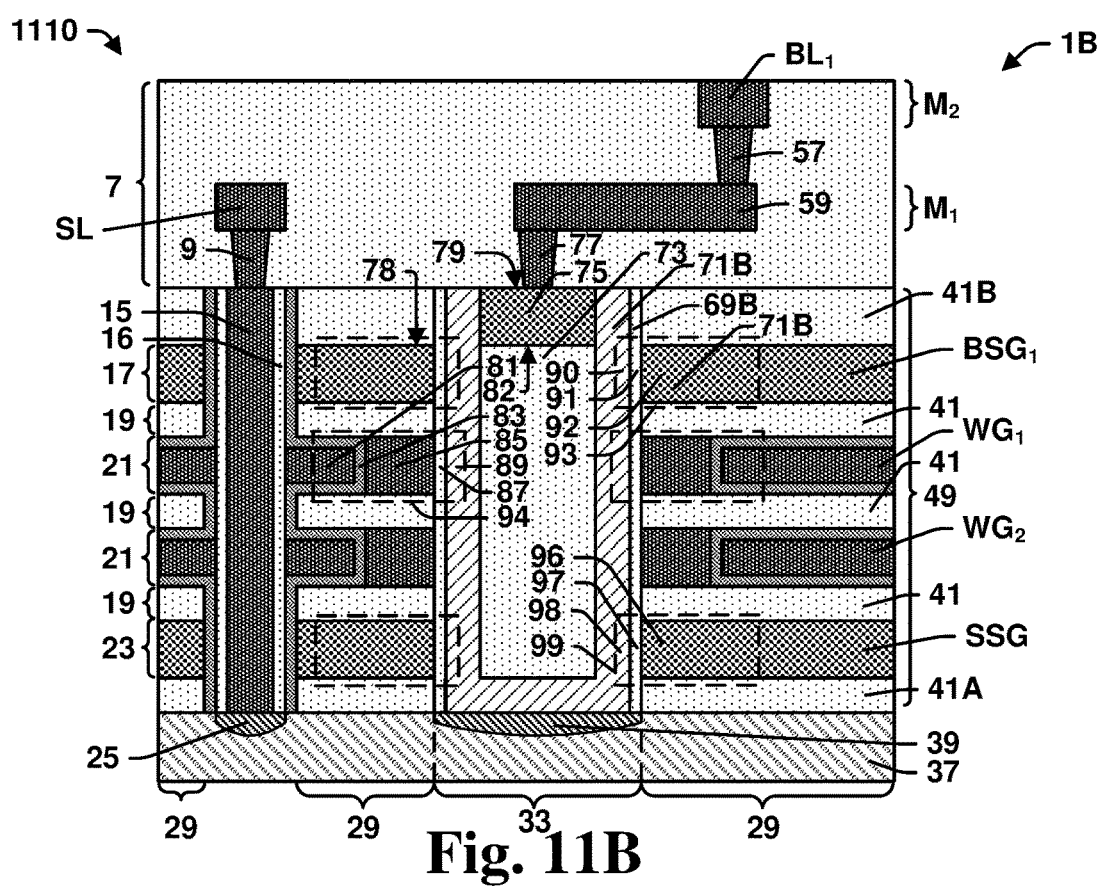
FIG. 11B illustrates a cross-sectional side view of a portion of a memory device in accordance with some other embodiments of the present disclosure.

FIG. 11B is a cross-sectional view 1110 that illustrates a memory device 1B that that is like the memory device 1 but has a different structure at the base of the channel via 79. The memory device 1B has a tunnel dielectric layer 69B that lines sidewalls of the channel via 79 but does not have a horizontal portion 30 (see FIG. 1) that extends across the semiconductor substrate 37. Also, the memory device 1B has a semiconductor layer 71B that is thicker at the base of the channel via 79. Relative advantages of the memory device 1 of FIG. 1 and the memory device 1B of FIG. 11B will be appreciated after the discussion of manufacturing methods that follows.

FIGS. 12 through 35 are cross-sectional view illustrations exemplifying a method according to the present disclosure of forming a memory device. While FIGS. 12 through 35 are described with reference to various embodiments of a method, it will be appreciated that the structures shown in FIGS. 12 through 35 are not limited to the method but rather may stand alone separate from the method. FIGS. 12 through 35 are described as a series of acts. The order of these acts may be altered in other embodiments. While FIGS. 12 through 35 illustrate and describe a specific set of acts, some may be omitted in other embodiments. Further, acts that are not illustrated and/or described may be included in other embodiments. While the method of FIGS. 12 through 35 is described in terms of forming the memory device 1, the method may be used to form other memory devices.

Figure 12:
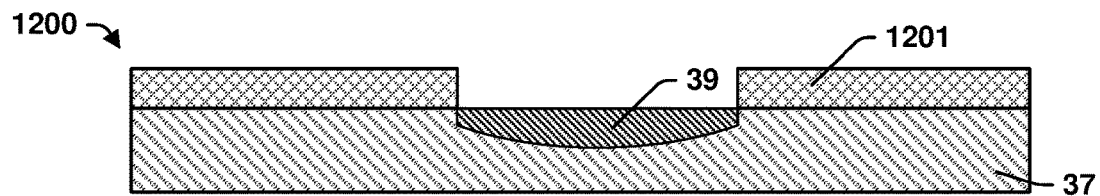
FIGS. 12-35 are a series of cross-sectional view illustrations exemplifying a method of according to some embodiments of the present disclosure.

As shown by the cross-sectional view 1200 of FIG. 12, the method may begin with forming a mask 1201 and doping an upper surface of the semiconductor substrate 37 to form first heavily doped area 39. The semiconductor substrate 37 may be any type of substrate that comprises a semiconductor. For example, the semiconductor substrate 37 may be a bulk substrate (e.g., a bulk silicon substrate), a silicon-on-insulator (SOI) substrate, the like, or any other suitable substrate. The semiconductor may be silicon, or another semiconductor material such as SiGe and/or other group III, group IV, and/or group V element, combination thereof, or the like. The first heavily doped area 39 is doped to a concentration of $10^{20}/cm^3$ or greater. The dopant may be p-type or n-type. In some embodiments, the dopant is n-type. A bulk of the semiconductor substrate 37 may by lightly doped with the same dopant type. Another option is to form a deep well of light doping with the same dopant type.

Figure 13:
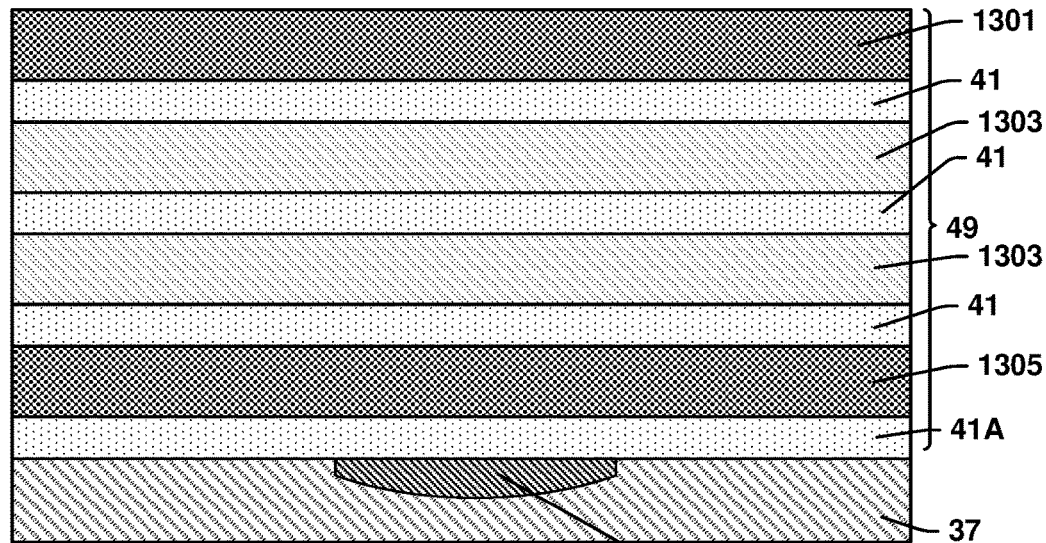

As shown by the cross-sectional view 1300 of FIG. 13, the method continues with forming the stack 49 over the semiconductor substrate 37. Forming the stack 49 includes sequentially forming the dielectric layer 41A, the SSG layer 1305, pairs of dielectric layers 41 and sacrificial layers 1303 according to a desired number of tiers in the memory device, another dielectric layer 41, and the BSG layer 1301. Forming these layers may include chemical vapor deposition (CVD), physical vapor deposition (PVD), atomic layer deposition (ALD), the like, or any other suitable process or combination of processes.

The dielectric layers 41 comprise a dielectric. In some embodiments, the dielectric is an oxide. In some embodiments, the dielectric is silicon dioxide. Other types of dielectrics may be used provided they provide adequate electrical isolation between memory cell layers 21 (see FIG. 1) and they have sufficient resistance to an etch processes that is effective for removing the sacrificial layers 1303.

The sacrificial layers 1303 may have any suitable composition. In some embodiments, the sacrificial layers 1303 are a nitride. In some embodiments, the sacrificial layers 1303 are silicon nitride. Other compositions may be used provided they lend themselves to removal by an etch processes that leaves the dielectric layers 41 intact.

In the illustrated embodiment, the BSG layer 1301 and the SSG layer 1305 are formed with conductive material. In some embodiments, the conductive material is polysilicon. Alternatively, the conductive material may be graphene, a metal, the like, or some other conductive material.

While in the embodiment illustrated by this process sequence the BSG layer 1301 and the SSG layer 1305 are formed with conductive material, in an alternative embodiment one or both of these layers is the same material as the sacrificial layers 1303 and may be a dielectric. Processing may continue as in the illustrated example. If both the BSG layer 1301 and the SSG layer 1305 are formed of the sacrificial material, the resulting memory device will have a structure like the one illustrated by the cross-sectional view 1100 of FIG. 11A.

Figure 14A:
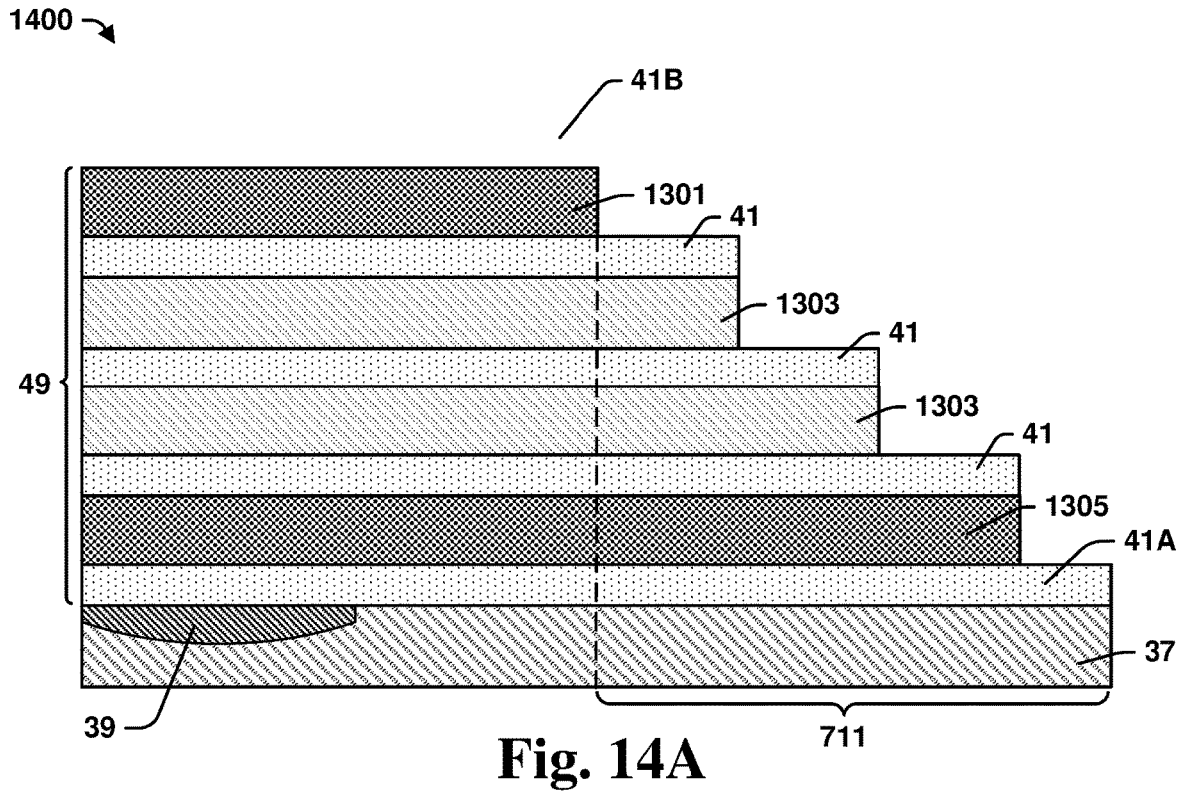
Figure 14B:
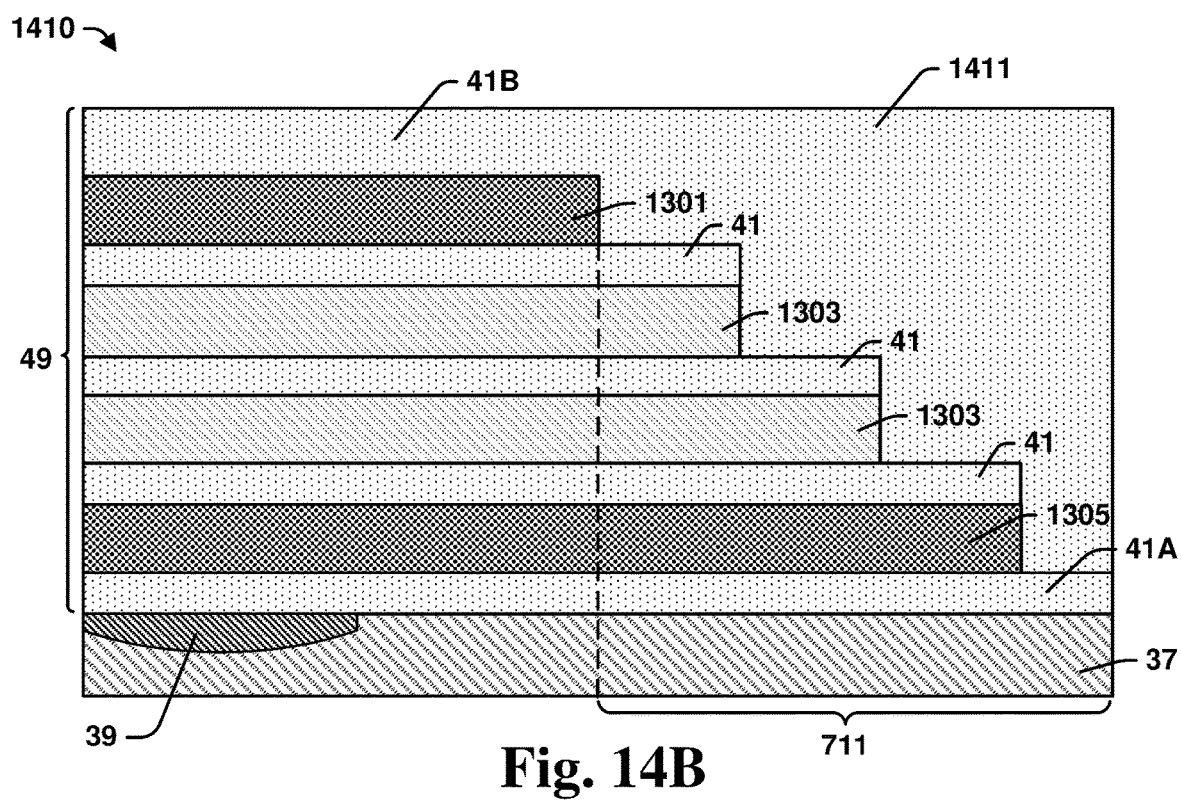

As shown by the cross-sectional view 1400 of FIG. 14A, the staircase pattern 711 may be formed on one side of the stack 49. Forming the staircase pattern 711 may include a series of masking and etching operations. As shown by the cross-sectional view 1410 of FIG. 14B, after forming the staircase pattern 711 a dielectric layer 1411 may be deposited. The dielectric layer 1411 closes off the ends of the sacrificial layers 1303 and may also provide or add to the dielectric layer 41B at the top of the stack 49.

Figure 15:
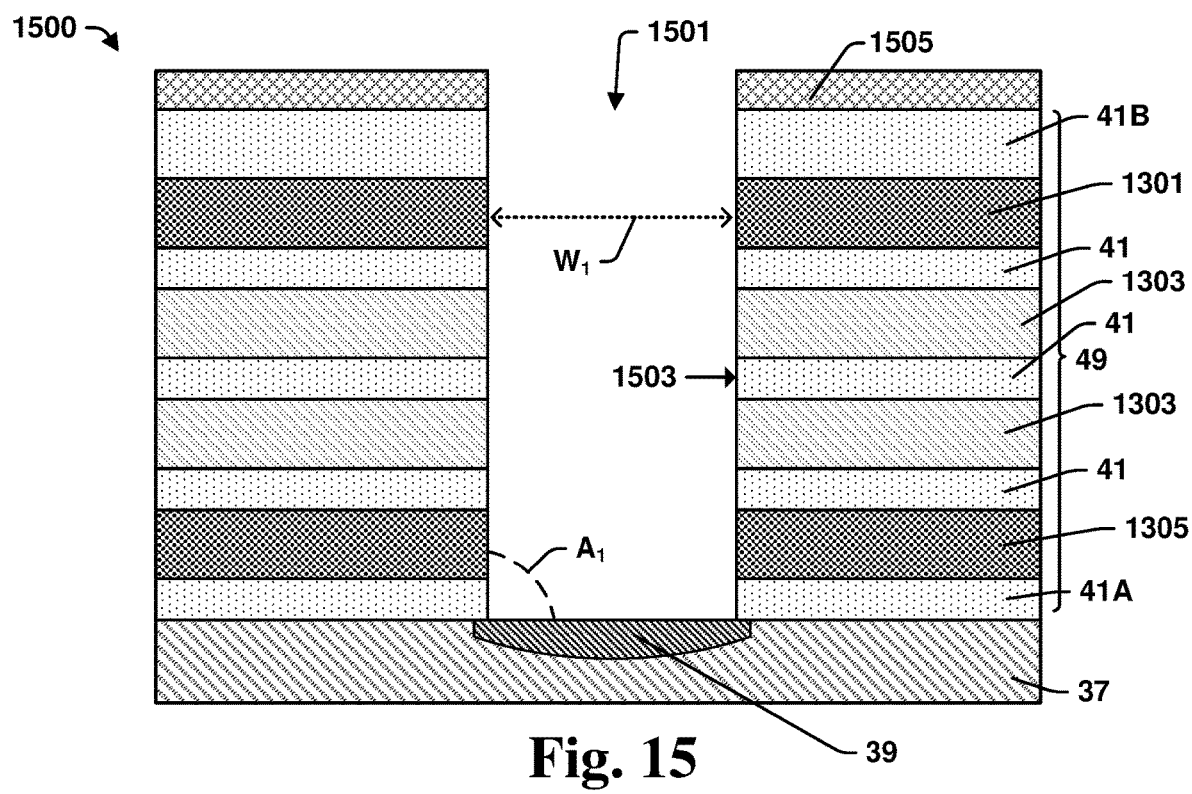

As shown by the cross-sectional view 1500 of FIG. 15, a mask 1505 may be formed and used to etch a channel hole 1501 through the stack 49. The mask 1505 may be formed using photolithography and may be stripped after etching the channel hole. The etch may include dry etching such as a plasma etching. The channel hole 1501 is positioned such that the first heavily doped area 39 is exposed through the channel hole 1501. The channel hole 1501 is surrounded by the stack 49 and adds sidewalls 1503 to the stack 49.

In some embodiments, the channel hole 1501 is circular in cross-section. It is desirable to make the channel hole 1501 perpendicular to the semiconductor substrate 37. In some embodiments, an angle A between the hole sidewall and the surface of the semiconductor substrate 37 is in the range from about 90° to about 100°. In some embodiments, the angle A is from about 90° to about 95°.

The channel hole 1501 is one of a plurality of channel holes 1501 in a pattern such as the pattern shown in FIG. 3 or the pattern shown in FIG. 4. The channel holes 1501 within the pattern have a pitch P (see FIG. 3 or 4) and widths $W_1$ (see FIG. 3, 4, or 15). In some embodiments, the pitch P is in the range from about 200 Å to about 4000 Å. In some embodiments, the pitch P is in the range from about 400 Å to about 2000 Å. In some embodiments, the width $W_1$ is in the range from about 200 Å to about 4000 Å. In some embodiments, the width $W_1$ is in the range from about 400 Å to about 2000 Å. In some embodiments, a ratio between the pitch P and the width $W_1$ is in the range from about 1:2 to about 2:1. In some embodiments, a ratio between the pitch P and the width $W_1$ is in the range from about 1:1.5 to about 1.5:1. The pitch P and the width $W_1$ may be nearly equal.

Figure 16:
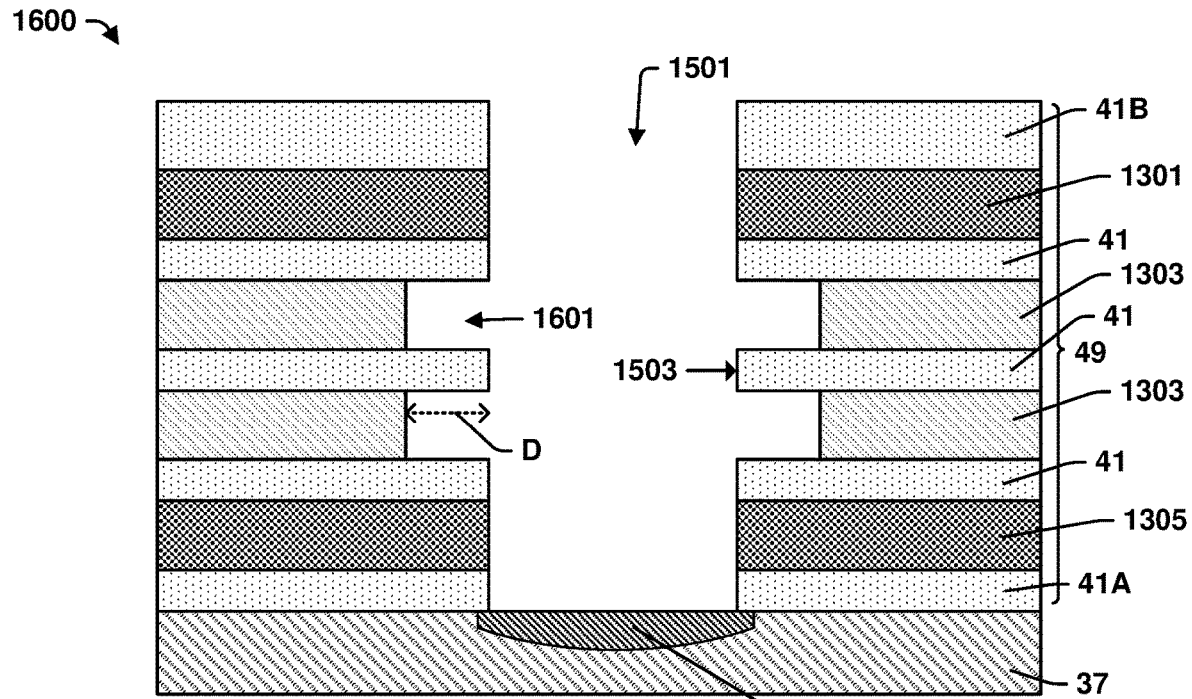

As shown by the cross-sectional view 1600 of FIG. 16, an etch process is carried out to recess the sacrificial layers 1303 from the channel holes 1501. Etching proceeds from the sidewalls 1503 and recesses the sacrificial layers 1303 a distance D from the channel holes 1501. In some embodiments, the distance D is from about 50 Å to about 1200 Å. In some embodiments, the distance D is from about 100 Å to about 600 Å. A smaller distance D will reduce an operative area of the data storage layer 83 relative to an operative area of the tunnel dielectric 87 in a memory cell 94 (see FIGS. 1 and 2). A larger distance D will increase the operative area of the data storage layer 83.

The etch process may comprise wet etching or the like. In some embodiments, the etch process is an acid etch. In some embodiments, the etchant comprises phosphoric acid or the like. In accordance with some embodiments, the etch process removes some, but not all, of each of the sacrificial layers 1303. The etching process produces voids 1601 between dielectric layers 41 in areas lateral to the channel holes 1501.

Figure 17:
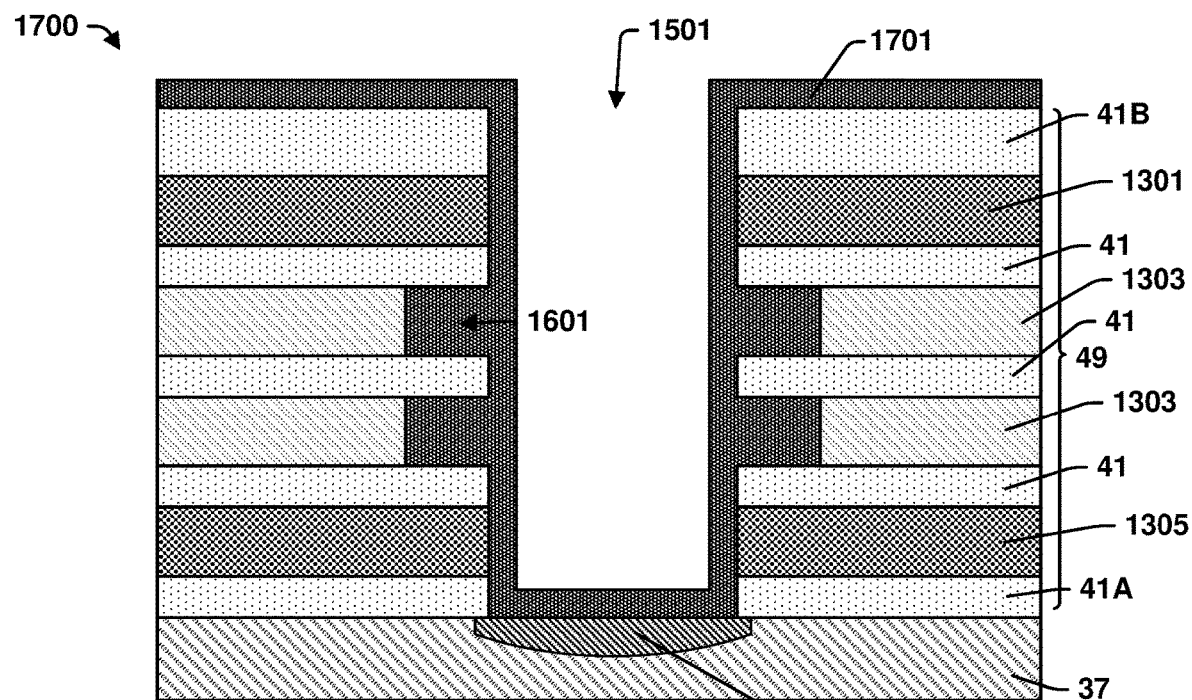

As shown by the cross-sectional view 1700 of FIG. 17, a conductive material 1701 may be deposited in a manner that fills the voids 1601. The conductive material 1701 may be a metal, a metal compound, polysilicon, graphene, the like, or any other suitable conductor. The conductive material may comprise multiple layers of various material. The conductive material 1701 may be deposited by CVD, PVD, ALD, the like, or any other suitable process or combination of processes. In some embodiments, the conductive material 1701 is a metal or metal compound. Examples of metals that may be suitable include tungsten (W), aluminum (Al), copper (Cu), titanium (Ti), tantalum (Ta), cobalt (Co), nickel (Ni), ruthenium (Ru), and the like. Examples of metals compounds that may be suitable include titanium nitride (TiN), tantalum nitride (TaN), tantalum aluminum nitride (TaAlN), and the like. Some of the conductive material 1701 may deposit on sidewalls of the channel hole 1501, at the bottom of the channel hole 1501, and above the stack 49.

Figure 18:
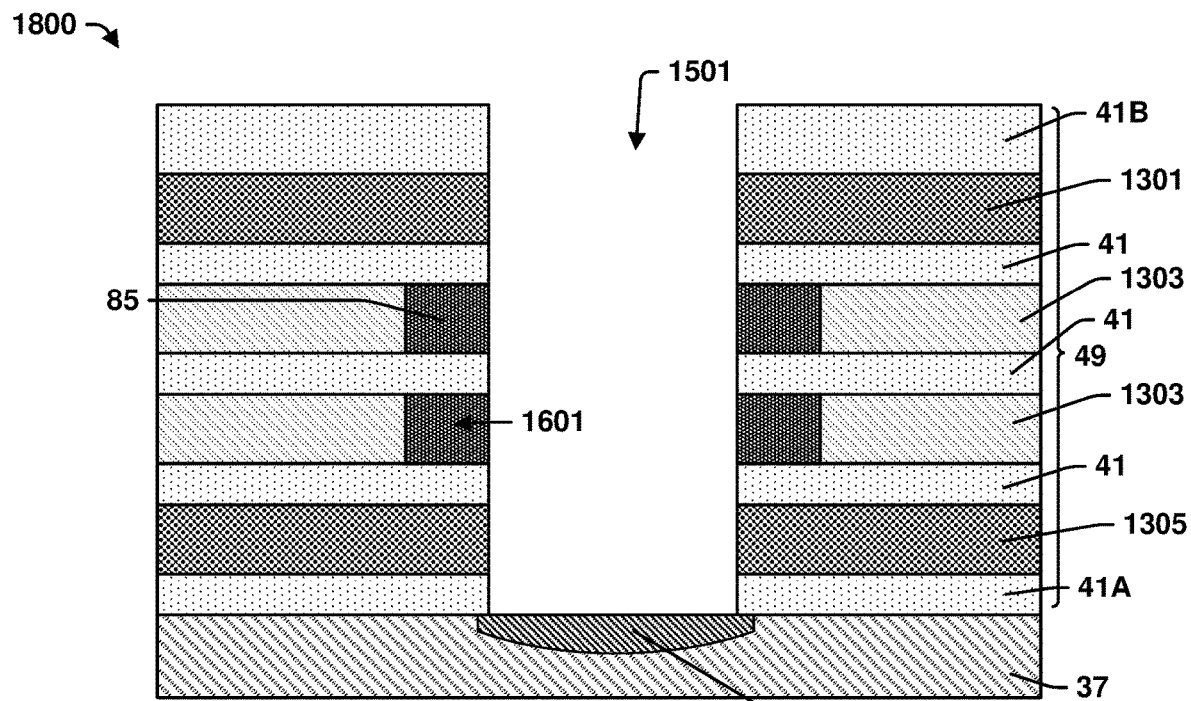

As shown by the cross-sectional view 1800 of FIG. 18, an etch process may be carried out to remove the conductive material 1701 that deposited outside the voids 1601. The conductive material 1701 that remains within the voids 1601 provides the floating gates 85. The etch process is an anisotropic etch and may comprise plasma etching or the like.

Figure 19:
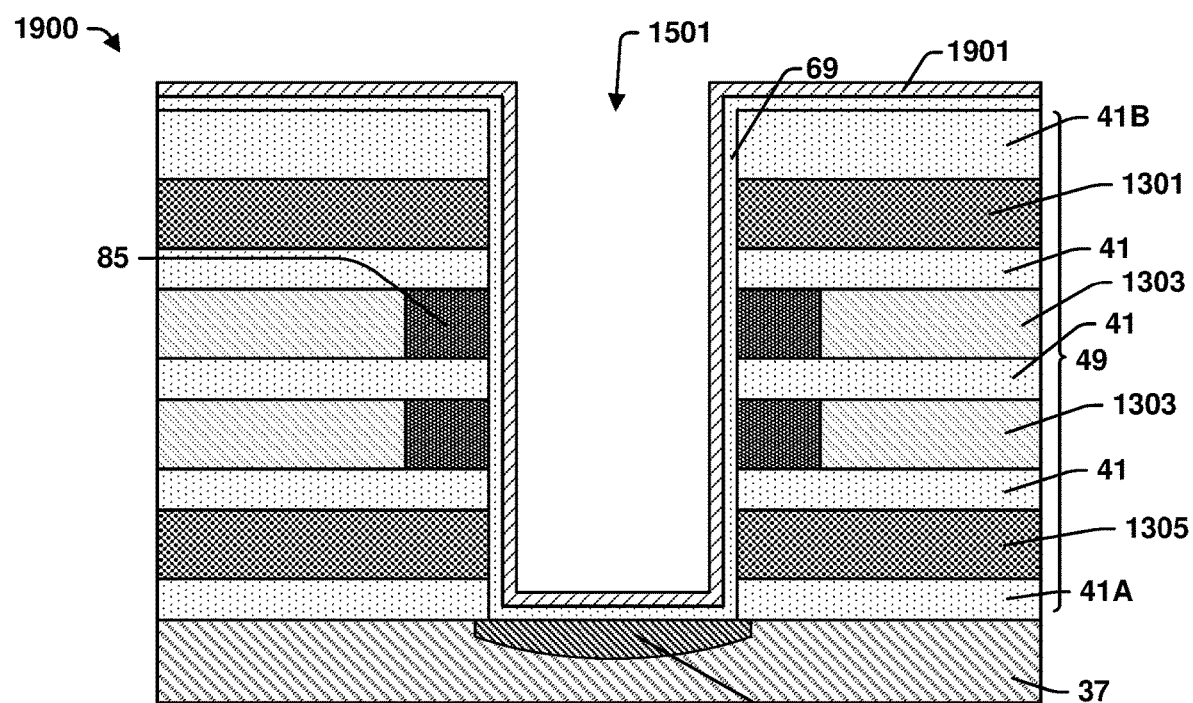

As shown by the cross-sectional view 1900 of FIG. 19, the tunnel dielectric layer 69 and a first semiconductor layer 1901 may then be deposited. These layers may be deposited by CVD, PVD, ALD, the like, or any other suitable process or combination of processes. The tunnel dielectric layer 69 and the first semiconductor layer 1901 may line the channel hole 1501.

The tunnel dielectric may be any material suitable for a gate dielectric. Examples of dielectric materials that may be suitable include silicon oxides ($SiO_x$), silicon carbonitride (SiCN), silicon oxycarbide (SiOC), and the like. In some embodiments, the tunnel dielectric layer 69 has a thickness in a range from about 10 Å to about 400 Å. In some embodiments, the tunnel dielectric layer 69 has a thickness in a range from about 20 Å to about 200 Å.

The first semiconductor layer 1901 may be any suitable semiconductor. In some embodiments, the first semiconductor layer 1901 is or comprises polysilicon or the like. Polysilicon has the advantage of providing high carrier mobility in a thin layer. In some embodiments, the first semiconductor layer 1901 is or comprises an oxide semiconductor. The oxide semiconductors may be, for example, indium gallium zinc oxide (InGaZnO or IGZO), indium zinc oxide (InZnO), indium gallium zinc tin oxide (InGaZnSnO or IGZTO), zinc oxide (ZnO), indium tungsten oxide (InWO), indium tin oxide (InSnO or ITO), combinations thereof, or the like. In some embodiments, the first semiconductor layer 1901 has a thickness in a range from about 10 Å to about 400 Å. In some embodiments, the first semiconductor layer 1901 has a thickness in a range from about 20 Å to about 200 Å.

Figure 20:
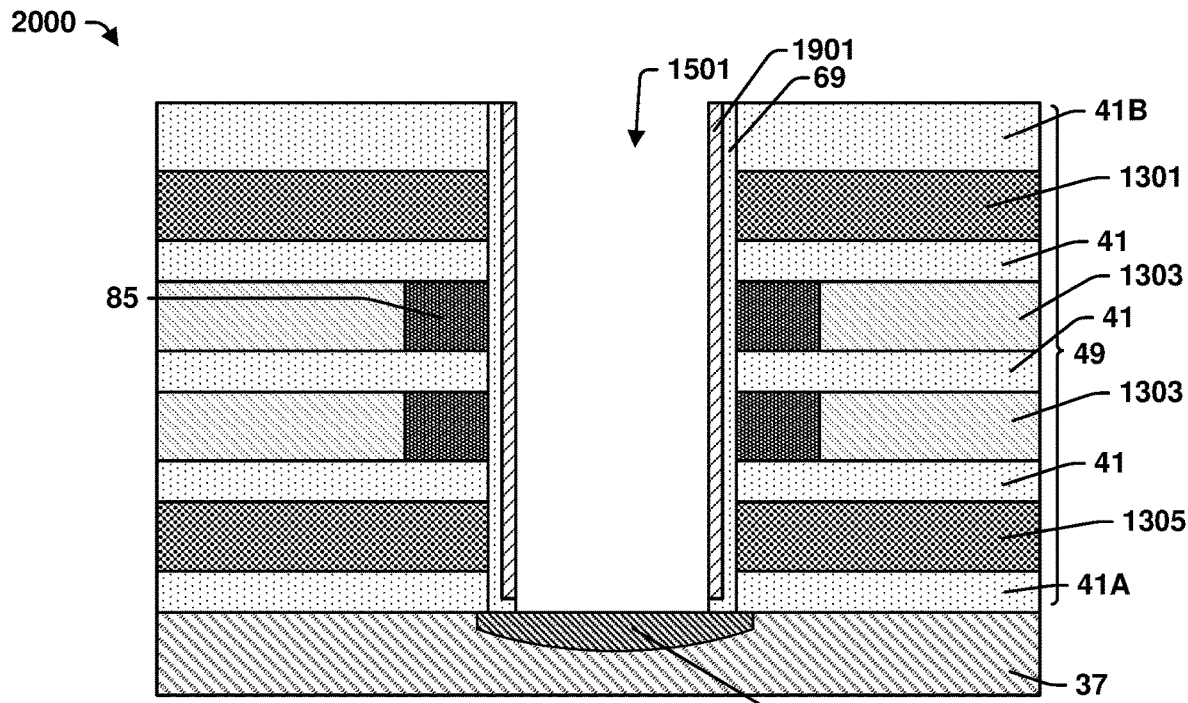

As shown by the cross-sectional view 2000 of FIG. 20, an anisotropic etch may be carrier out to expose the semiconductor substrate 37 through the channel hole 1501. The etch may remove the tunnel dielectric layer 69 and the first semiconductor layer 1901 from an upper surface of the stack 49. The etch may be, for example, a plasma etch or the like.

Figure 21:
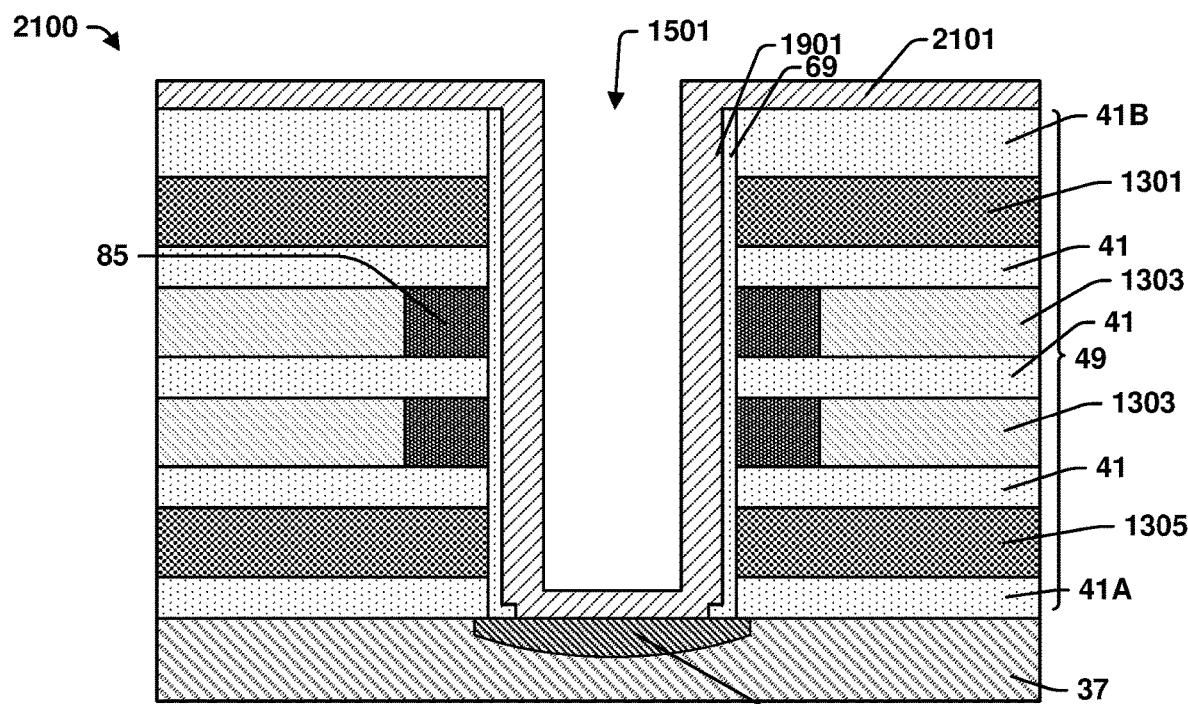

As shown by the cross-sectional view 2100 of FIG. 21, a deposition process may be carried out to form a second semiconductor layer 2101. The second semiconductor layer 2101 may thicken the first semiconductor layer 1901 and put it into communication with the first heavily doped area 39. The composition and formation processes options for the second semiconductor layer 2101 are the same as for the first semiconductor layer 1901. In some embodiments, the second semiconductor layer 2101 has the same composition as the first semiconductor layer 1901. In some embodiments, the second semiconductor layer 2101 has a thickness in a range from about 20 Å to about 400 Å. In some embodiments, the second semiconductor layer 2101 has a thickness in a range from about 40 Å to about 200 Å.

Figure 22:
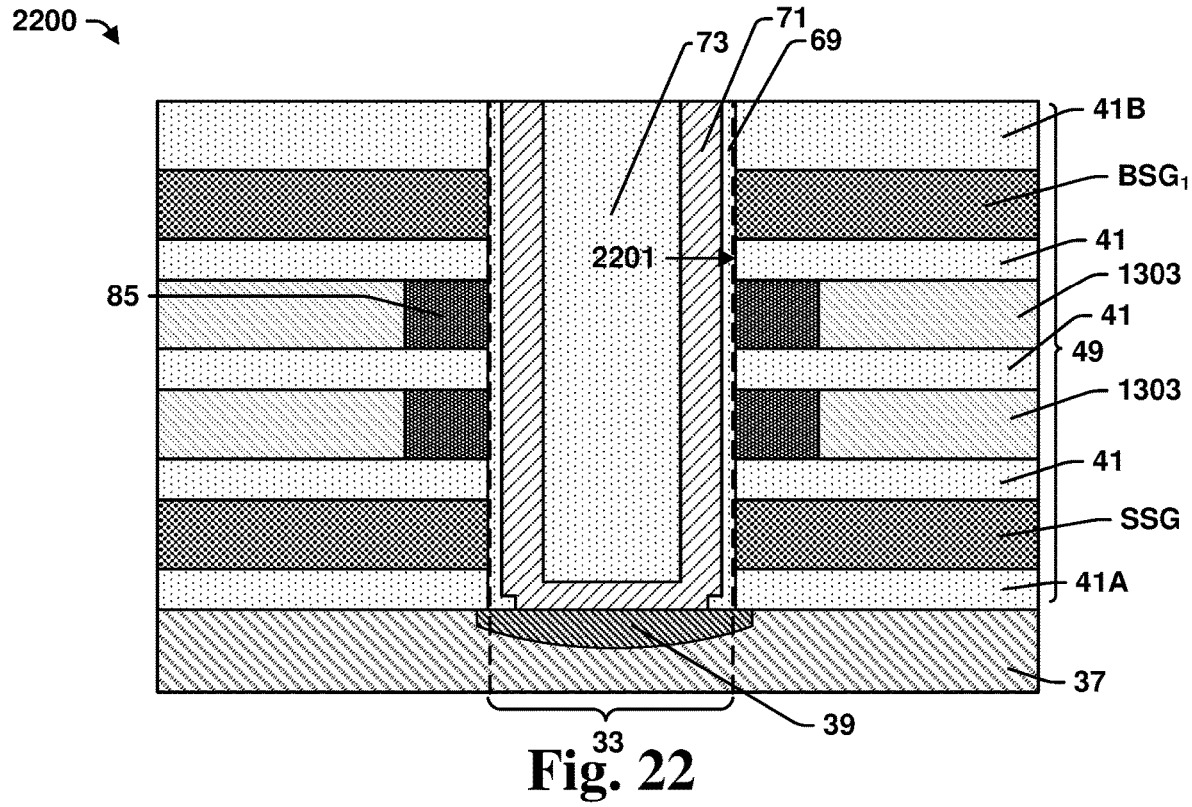

As shown by the cross-sectional view 2200 of FIG. 22, a dielectric 73 may be deposited to fill the channel hole 1501 followed by chemical mechanical polishing to remove the second semiconductor layer 2101 and excess dielectric 73 from the top of the stack 49. The dielectric 73 may be any suitable dielectric. The dielectric 73 may be, for example, silicon dioxide or the like. The portions of the second semiconductor layer 2101 and the first semiconductor layer 1901 that remain are within the channel hole 1501 and provide the semiconductor layer 71. The materials that fill the channel hole 1501, which include the tunnel dielectric layer 69, the semiconductor layer 71, and the dielectric 73, constitute the channel via 79. The dielectric layers 41 have aligned side surfaces 2201 that border the channel via 79.

Figure 23:
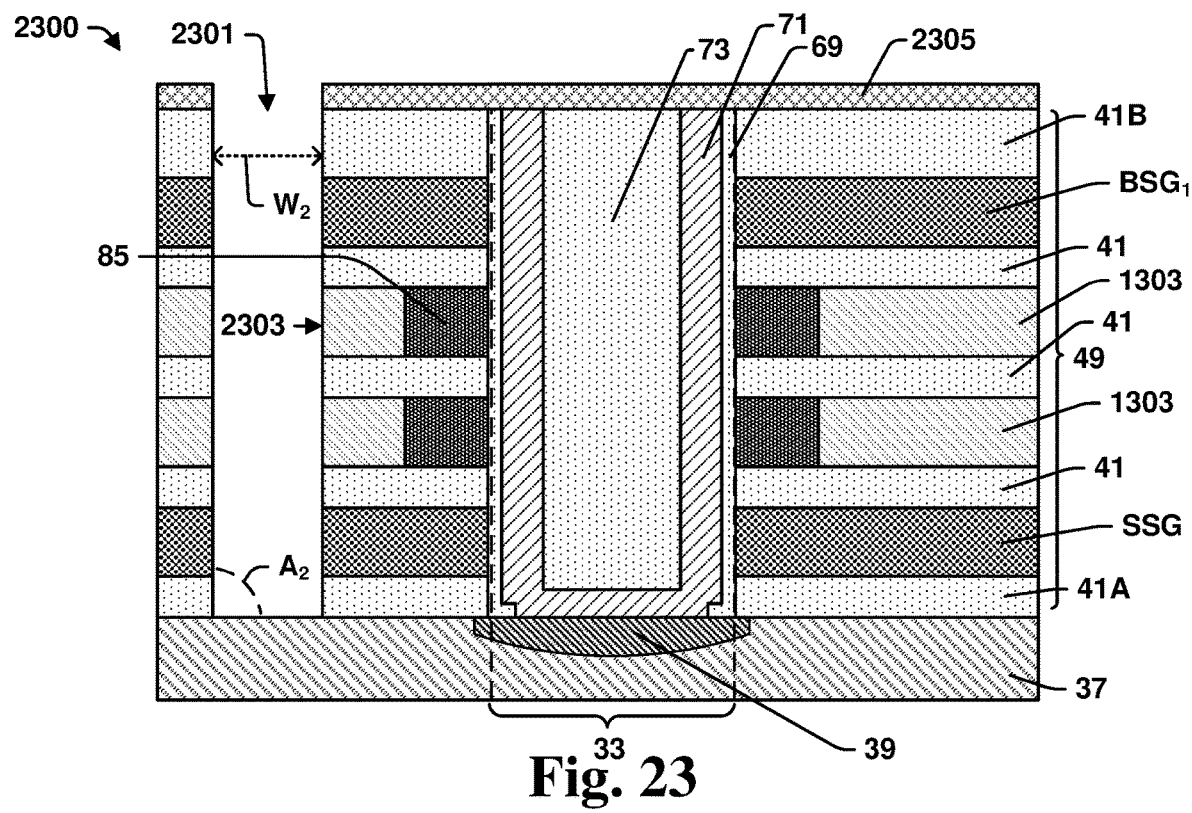

As shown by the cross-sectional view 2300 of FIG. 23, a mask 2305 may be formed and used to etch trenches 2301 through the stack 49. The mask 2305 may be formed using photolithography and may be stripped after etching the trenches 2301. The etch may include dry etching such as plasma etching or the like. The trenches 2301 divide the BSG layer 1301 into a plurality of bit line-connection select gates $BSG_1$, $BSG_2$, etc. The trenches 2301 also divide the SSG layer 1305 into a plurality of source line-connection select gates SSG, add sidewalls 2303 to the stack 49, and expose the semiconductor substrate 37. It is desirable to make the trenches 2301 perpendicular to the semiconductor substrate 37. An angle $A_2$ between a sidewall of a trench 2301 and a surface of the semiconductor substrate 37 is in the range from about 90° to about 100°. In some embodiments, the angle $A_2$ is from about 90° to about 95°. In some embodiments, a width $W_2$ of the trenches 2301 is in the range from about 25 nm to about 10 µm. In some embodiments, the width $W_2$ is in the range from about 50 nm to about 5 µm.

The trenches 2301 illustrated in these examples are linear, however, the trenches may be curved or otherwise vary in shape. One of the functions of the trenches 2301 is to divide the BSG layer 1301 into a plurality of bit line-connection select gates. The SSG layer 1305 need not be divided into a plurality of source line-connection select gates. The word gate electrodes in any one of the memory cell layers 21 may also be united among sectors. If another process or a separate etch is used to divide the BSG layer 1301 into bit line-connection select gates $BSG_1$, $BSG_2$, etc., then the trenches 2301 may be holes rather than trenches.

Another function of the trenches 2301 is to produce the sidewalls 2303 through which a remaining portion of the sacrificial layers 1303 may be replaced. In some embodiments, holes (not shown) are formed in the stack 49 to serve this function. In some embodiments, holes are used in addition to the trenches 2301 to facilitate removal and replacement of the remaining portions of the sacrificial layers 1303. Such holes may be filled to produce dummy vias within the patterns of FIGS. 4A and 4B.

Figure 24:
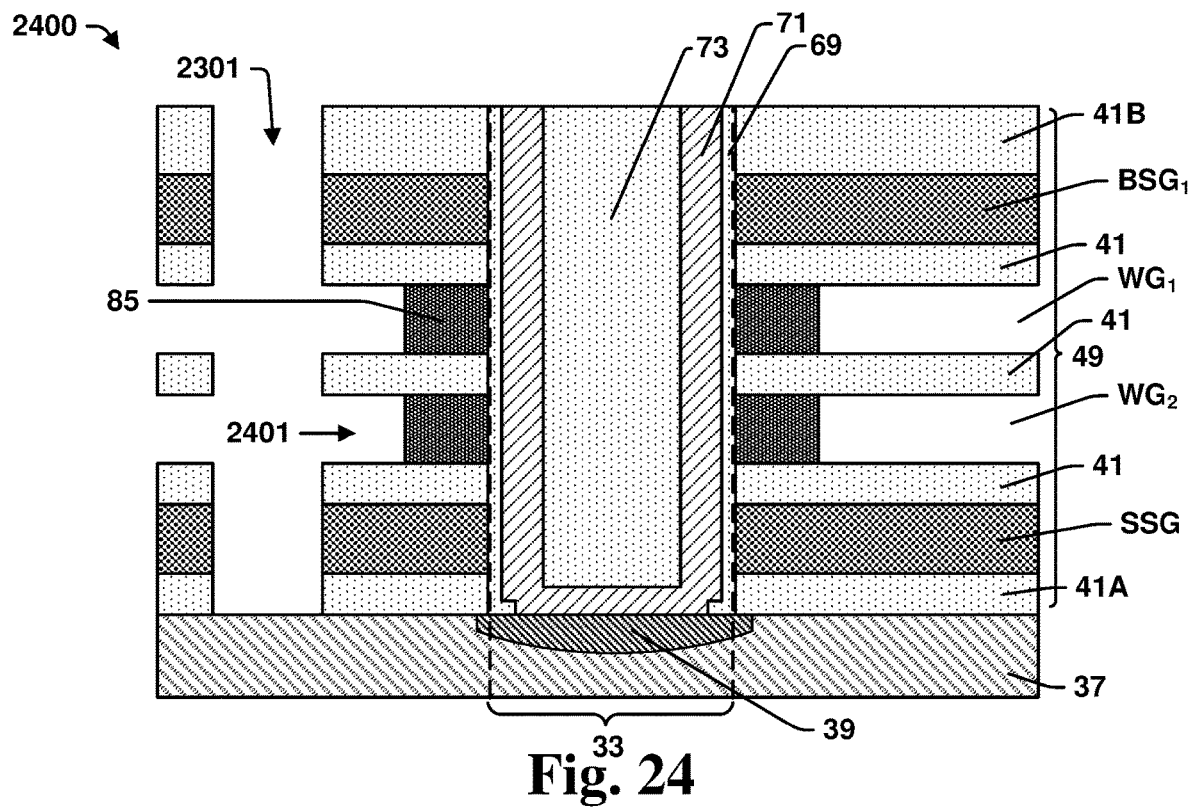

As shown by the cross-sectional view 2400 of FIG. 24, an etch process is carried out to remove a remaining portion of the sacrificial layers 1303. The etch process may comprise wet etching or the like. In some embodiments, the etch process is an acid etch. In some embodiments, the etchant comprises phosphoric acid or the like. The etching produces voids 1601 between dielectric layers 41 in areas lateral to the trenches 2301.

Figure 25:
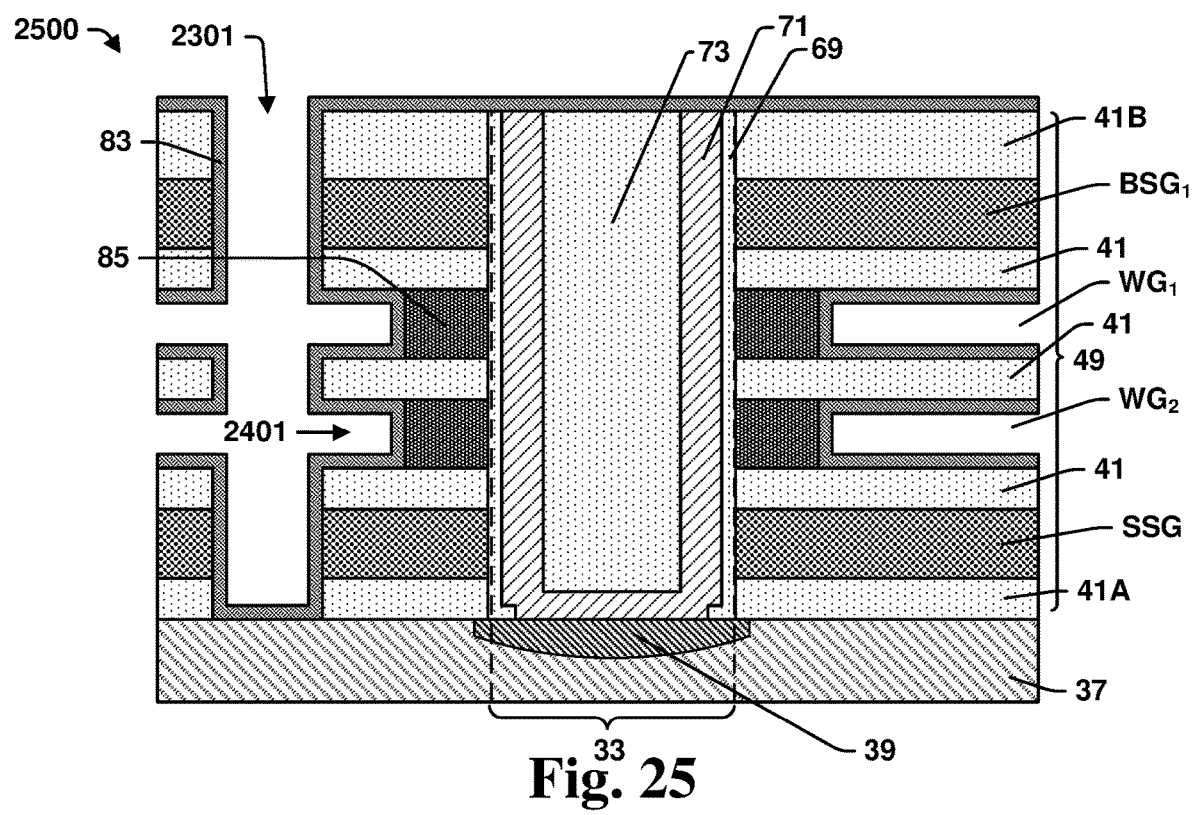

As shown by the cross-sectional view 2500 of FIG. 25, the data storage layer 83 may be deposited through the trenches 2301 in such a way as to abut the floating gates 85 and line the voids 1601. The data storage layer 83 may comprise one or more layers of various materials. The layers may be deposited by CVD, PVD, ALD, the like, or any other suitable process or combination of processes. In some embodiments, the data storage layer 83 has a thickness in a range from about 10 Å to about 400 Å. In some embodiments, the data storage layer 83 has a thickness in a range from about 20 Å to about 200 Å.

In some embodiments the memory device 1 is an MFMIS memory device and the data storage layer 83 is a ferroelectric layer that retains a polarization of electrical dipoles. Examples of materials that may be used for a ferroelectric layer include hafnium oxide ($HfO_2$), hafnium silicon oxide (HfSiO), hafnium zirconium oxide (HfZrO or HZO), aluminum oxide ($Al_2O_3$), titanium oxide ($TiO_2$), lanthanum oxide ($LaO_x$), strontium barium titanate ($SrBaTiO_x$ or SBT), lead zirconium titanate ($PbZrTiO_x$ or PZT), barium lanthanum titanate ($BaLaTiO_x$ or BLT) or the like.

In some embodiments the memory device 1 is an ReRAM memory device and the data storage layer 83 comprises a metal oxide having a resistance that may be varied through reversible formation of conductive bridges. Examples of metal oxides that may be suitable for the data storage structure of an ReRAM memory device include hafnium oxides ($HfO_x$), nickel oxides ($NiO_x$), tantalum oxides ($TaO_x$), tantalum hafnium oxide ($TaHfO_x$), tantalum aluminum oxides ($TaAlO_x$), tungsten oxides ($WO_x$), zirconium oxides ($ZrO_x$), aluminum oxides ($AlO_x$), strontium titanium oxides ($SrTiO_x$), and the like. The data storage layer 83 may further include an active metal layer that alternate donates and receives ions from the metal oxide layer. One of the electrodes that is adjacent to the data storage layer 83 may provide the active metal layer.

In some embodiments the memory device 1 is an PCRAM memory device and the data storage layer 83 comprises a chalcogenide glass. A chalcogenide glass has crystalline and amorphous states with markedly different electrical resistivity values. The chalcogenide glass may include one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like.

In some embodiments the memory device 1 is an MRAM memory device and the data storage layer 83 comprises a metal tunneling junction (MTJ). An MTJ comprises a pinned layer separated from a free layer by a tunnel barrier layer. An antiferromagnetic layer may be included to maintain the polarity of the pinned layer. The pinned layer may comprise cobalt (Co), iron (Fe), boron (B), nickel (Ni), ruthenium (Ru), iridium (Ir), platinum (Pt), or the like. The tunnel barrier layer may comprise magnesium oxide (MgO), aluminum oxide ($Al_2O_3$), or the like. The free layer may comprise cobalt (Co), iron (Fe), boron (B), or the like.

In some embodiments, all of the data storage layers are formed through the trenches 2301 and deposit in the voids 2401. This may be desirable to maintain the thickness of the floating gates 85 and to prevent any of the data storage layers from extending adjacent the tunnel dielectric layer 69. But depending on the memory type, in some embodiments one or more layers of the data storage layer 83 are formed through the channel holes 1501 and deposit in the voids 1601 (see FIGS. 16 and 17).

Figure 26:
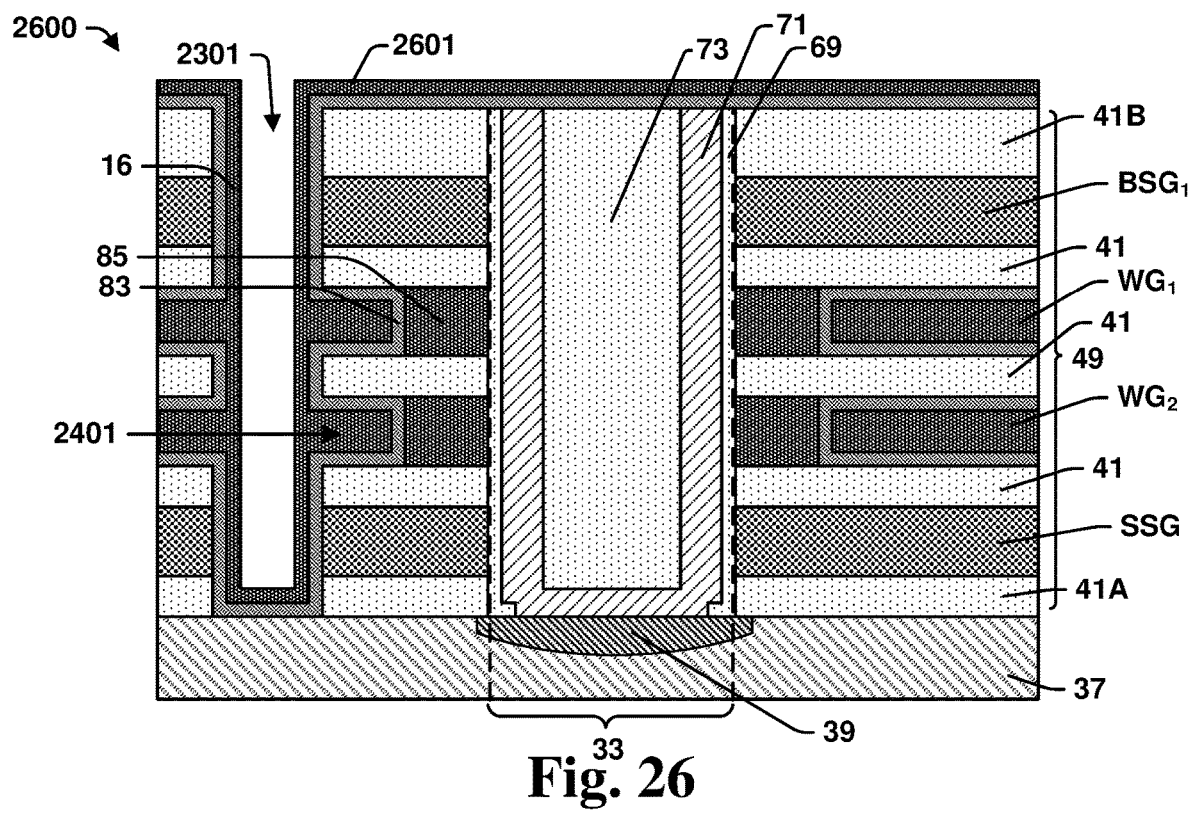

As shown by the cross-sectional view 2600 of FIG. 26, a conductive material 2601 may be deposited in a manner that fills the voids 2401. The conductive material 2601 may be the same or different from the conductive material 1701 that provides the floating gates 85 (see FIGS. 17 and 18). The conductive material 2601 may be a metal, a metal compound, polysilicon, graphene, the like, or any other suitable conductor. The conductive material may comprise multiple layers of various material. The conductive material 2601 may be deposited by CVD, PVD, ALD, the like, or any other suitable process or combination of processes. In some embodiments, the conductive material 2601 is a metal or metal compound. Examples of metals that may be suitable include tungsten (W), aluminum (Al), copper (Cu), titanium (Ti), tantalum (Ta), cobalt (Co), nickel (Ni), ruthenium (Ru), and the like. Examples of metals compounds that may be suitable include titanium nitride (TiN), tantalum nitride (TaN), tantalum aluminum nitride (TaAlN), and the like. Some of the conductive material 2601 may deposit on sidewalls of the trench 2301, above the stack 49, and at the bottom of the trench 2301.

Figure 27:
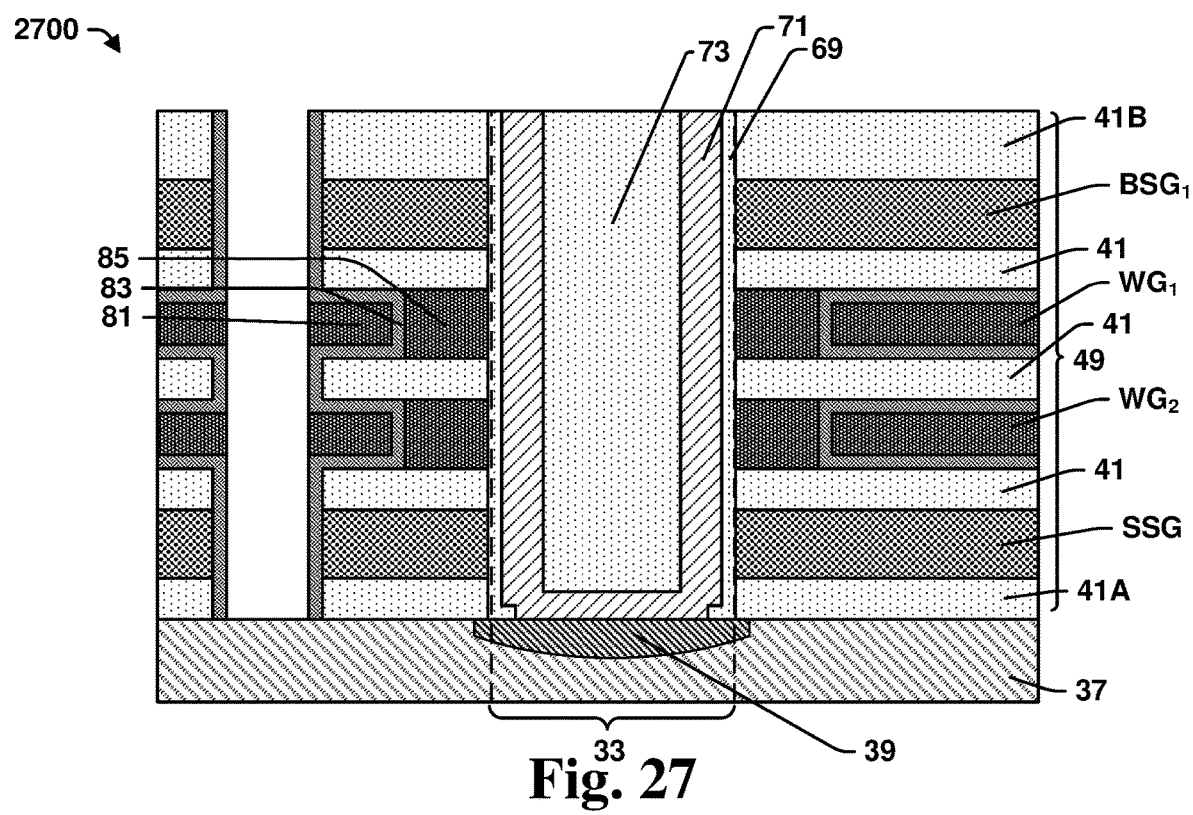

As shown by the cross-sectional view 2700 of FIG. 27, an etch process may be carried out to remove conductive material 2601 that is not masked by the data storage layer 83. The etch may continue until the data storage layer 83 is removed from the top of the stack 49 and the semiconductor substrate 37 is exposed at the bottom of the trench 2301. The conductive material 2601 that remains within the voids 2401 provides the gate electrodes 81. The etch process is an anisotropic etch and may comprise plasma etching or the like.

Figure 28:
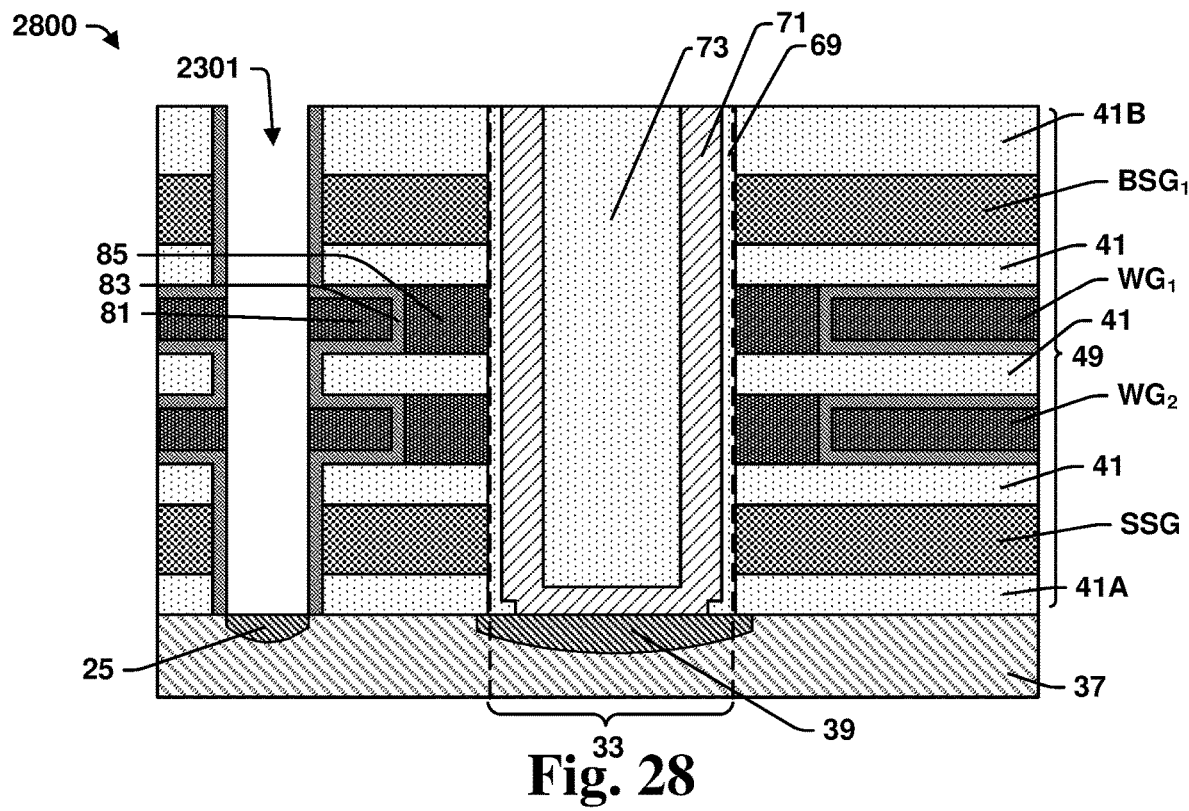

As shown by the cross-sectional view 2800 of FIG. 28, ion implantation may be carried out to form the second heavily doped area 25 in the semiconductor substrate 37 exposed at the bottom of the trench 2301. The second heavily doped area 25 is doped to a concentration of $10^{20}/cm^3$ or greater. The doping type is the same as for the first heavily doped area 39.

Figure 29:
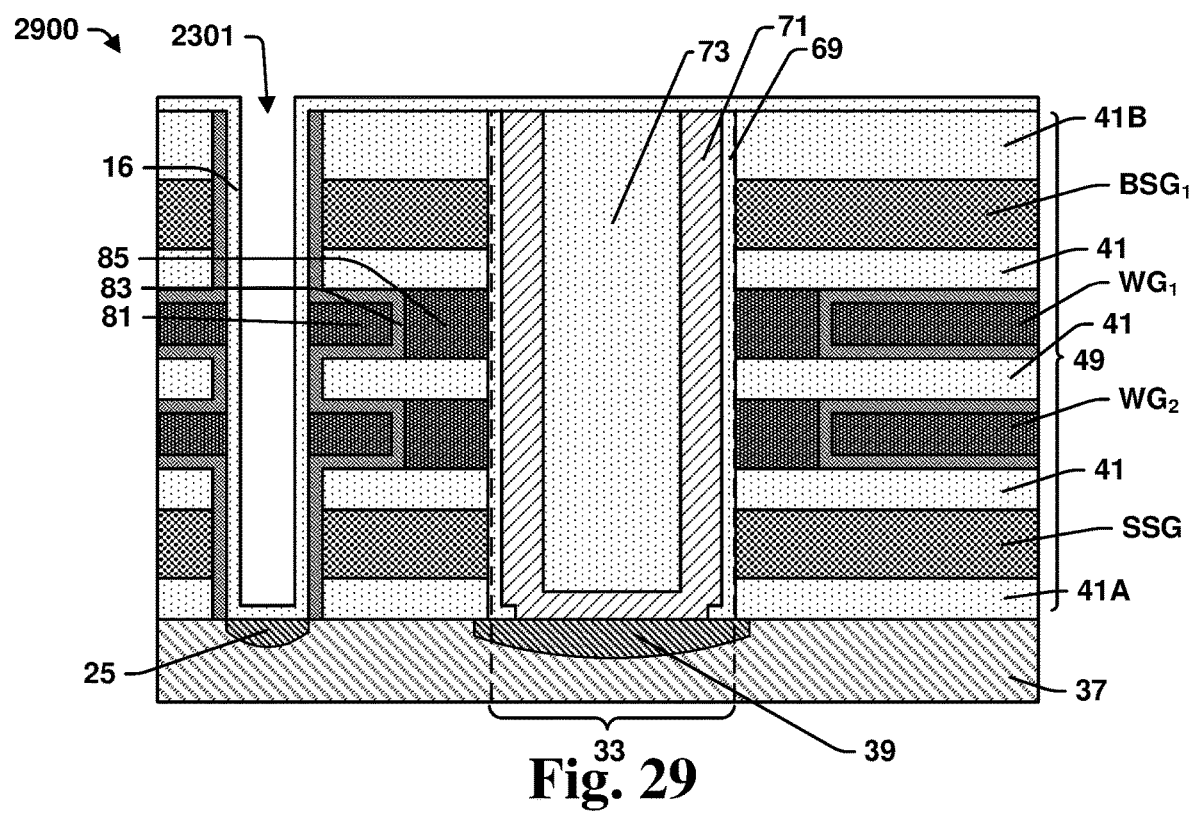

As shown by the cross-sectional view 2900 of FIG. 29, the dielectric layer 16 may be deposited in such a way as line the sides and bottom of the trench 2301. The dielectric layer 16 may be an oxide, a nitride, SiOC, SiCN, the like, or any other suitable dielectric. The dielectric layer 16 may be deposited by CVD, PVD, ALD, the like, or any other suitable process or combination of processes.

Figure 30:
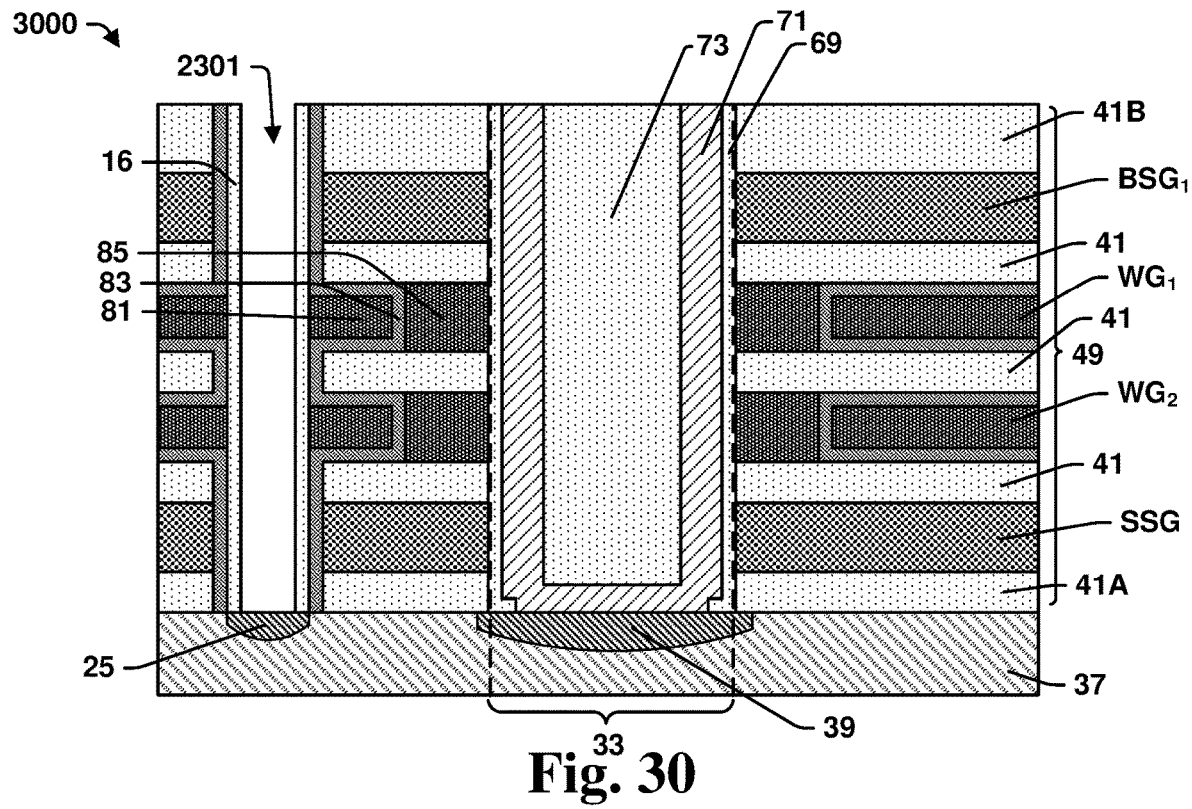

As shown by the cross-sectional view 3000 of FIG. 30, an etch process may be used to remove some of the dielectric layer 16 from the bottom of the trench 2301 so as to expose the second heavily doped area 25. The etching may also remove the dielectric layer 16 for over the stack 49. The etch may be an anisotropic dry etch such as an anisotropic plasma etch or the like.

Figure 31:
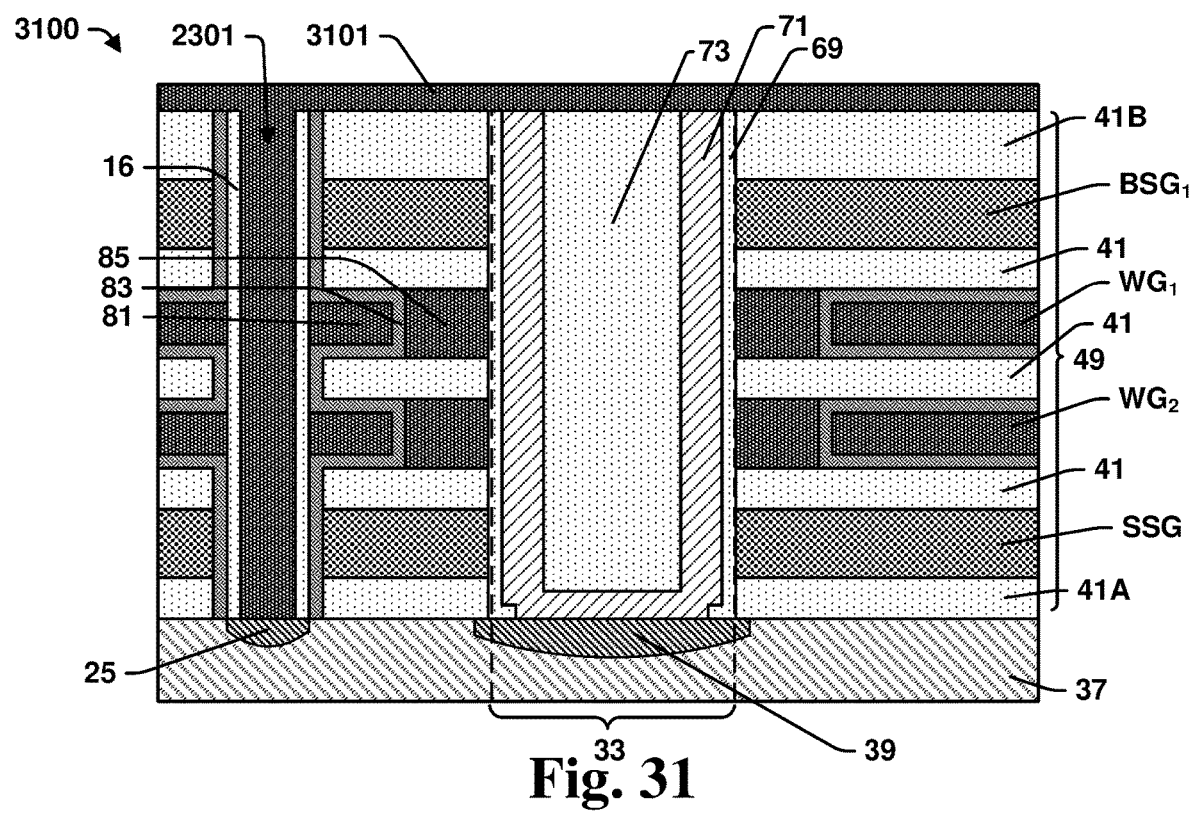

As shown by the cross-sectional view 3100 of FIG. 31, conductive material 3101 may be deposited so as to fill the trenches 2301. The conductive material 3101 may be the same as or different from the conductive materials 1701 and 2601 (see FIGS. 17 and 26). The conductive material 3101 may be a metal, a metal compound, polysilicon, graphene, the like, or any other suitable conductor. The conductive material may comprise multiple layers of various material. The conductive material 3101 may be deposited by CVD, PVD, ALD, the like, or any other suitable process or combination of processes. In some embodiments, the conductive material 3101 is a metal or metal compound. Some of the conductive material 3101 may deposit above the stack 49.

Figure 32:
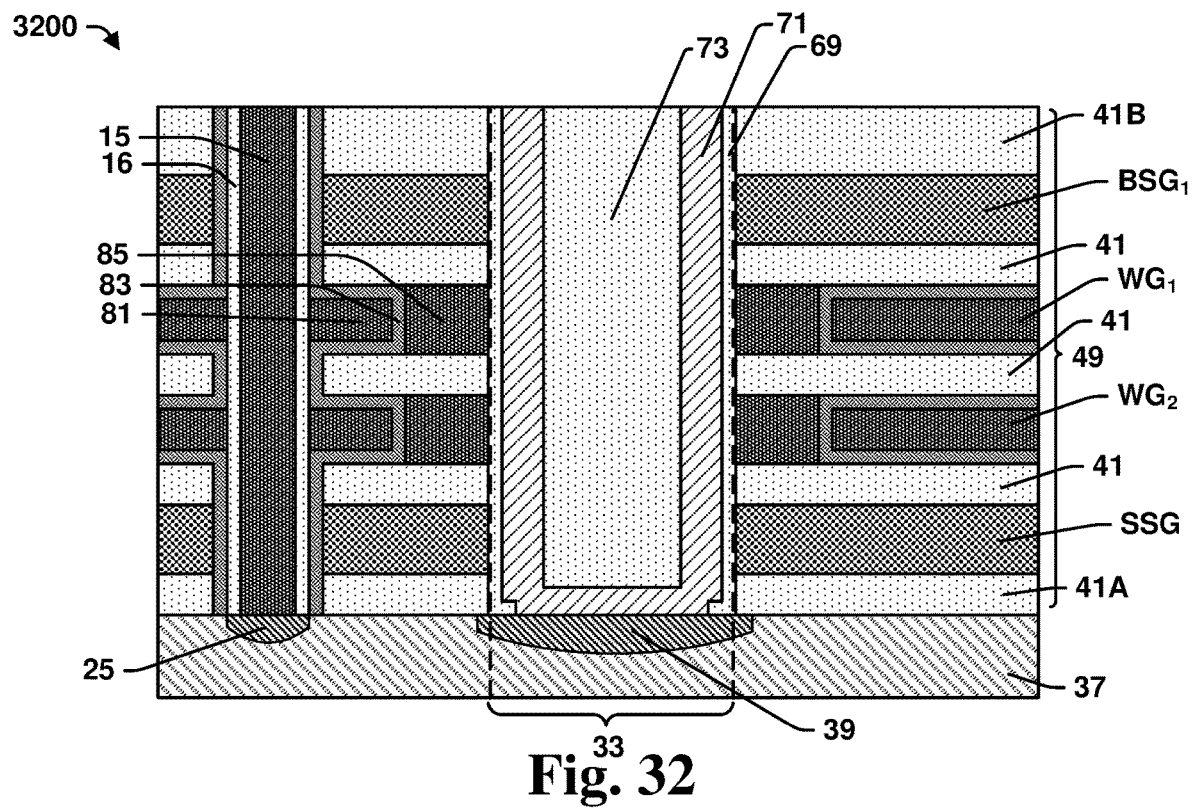

As shown by the cross-sectional view 3200 of FIG. 32, a process may be carrier out to remove the conductive material 3101 that is above the stack 49. The removal process could be an etch or a planarization process, such as CMP. The conductive material 3101 that remains is within the trench 2301 and provides the conductive slab 15.

Figure 33:
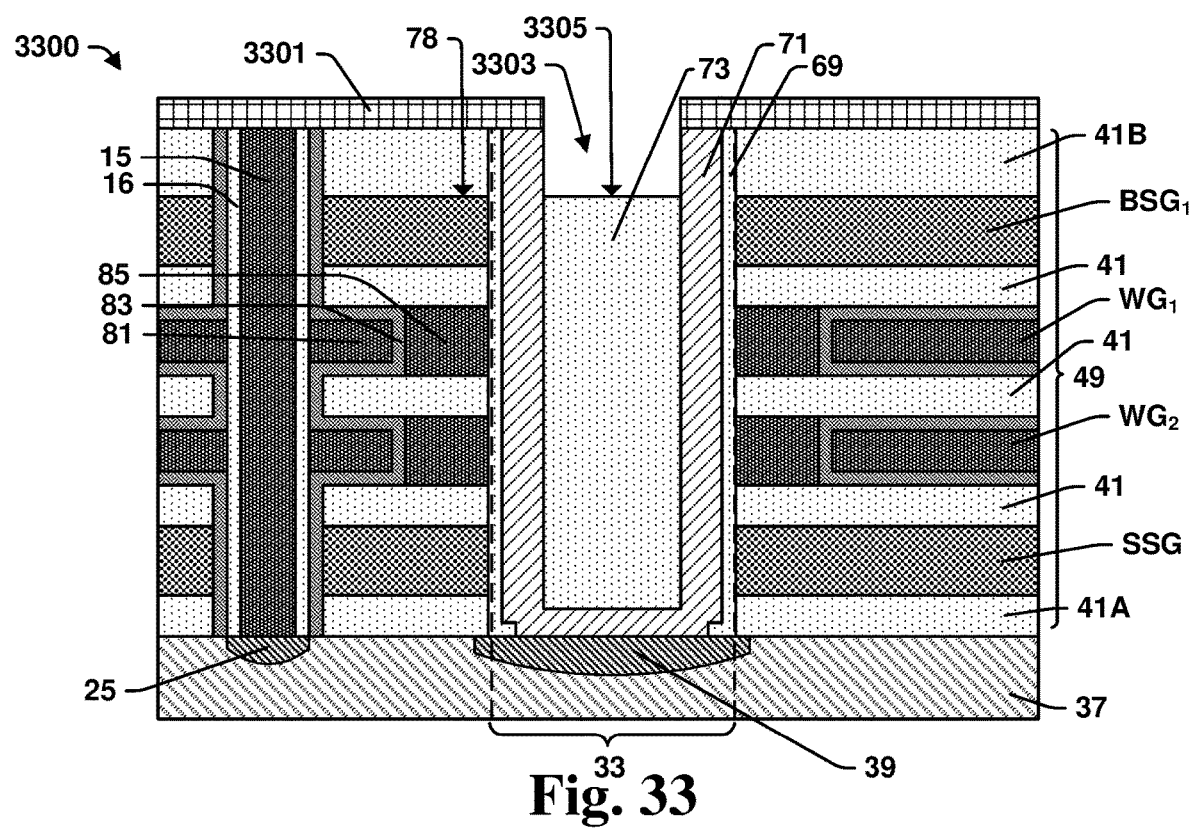

As shown by the cross-sectional view 3300 of FIG. 33, a mask 3301 may be formed and an etch process may be conducted to recess the dielectric 73 until an upper surface 3305 of the dielectric 73 is at or near the same height above the semiconductor substrate 37 as (vertically aligned with) the upper surface 78 of the bit line-connection select gate $BSG_1$. The etch may be a dry etch or a wet etch. Recessing the dielectric 73 creates a void 3303 over the dielectric 73. The semiconductor layer 71 is exposed at the sides of the void 3303. After etching, the mask 3301 may be stripped.

Figure 34:
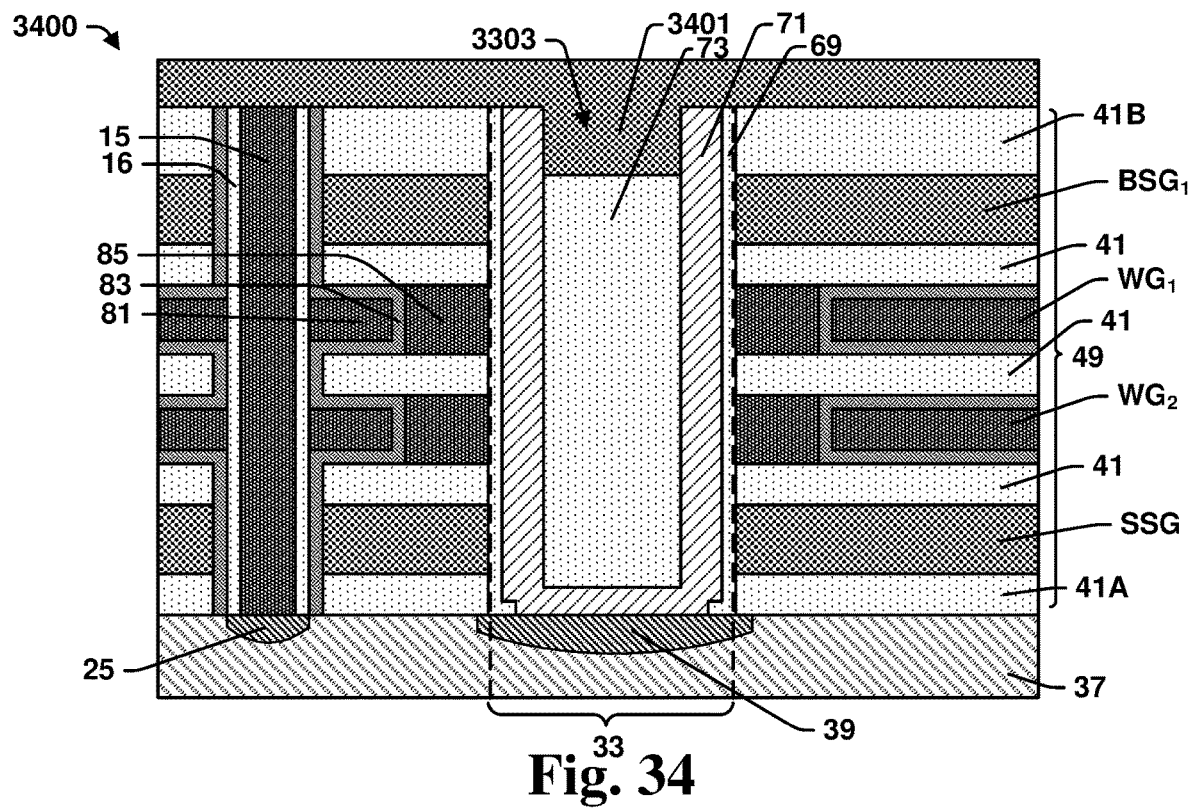

As shown by the cross-sectional view 3400 of FIG. 34, a conductive material 3401 may be deposited so as to fill the void 3303. The conductive material 3401 may be a metal, a metal compound, polysilicon, graphene, the like, or any other suitable conductor. In some embodiments, The conductive material may comprise multiple layers of various material. The conductive material 3401 may be deposited by CVD, PVD, ALD, the like, or any other suitable process or combination of processes. In some embodiments, the conductive material 3401 is a metal or metal compound. In some embodiments, the conductive material 3401 is polysilicon or the like. Some of the conductive material 3401 may deposit above the stack 49.

Figure 35:
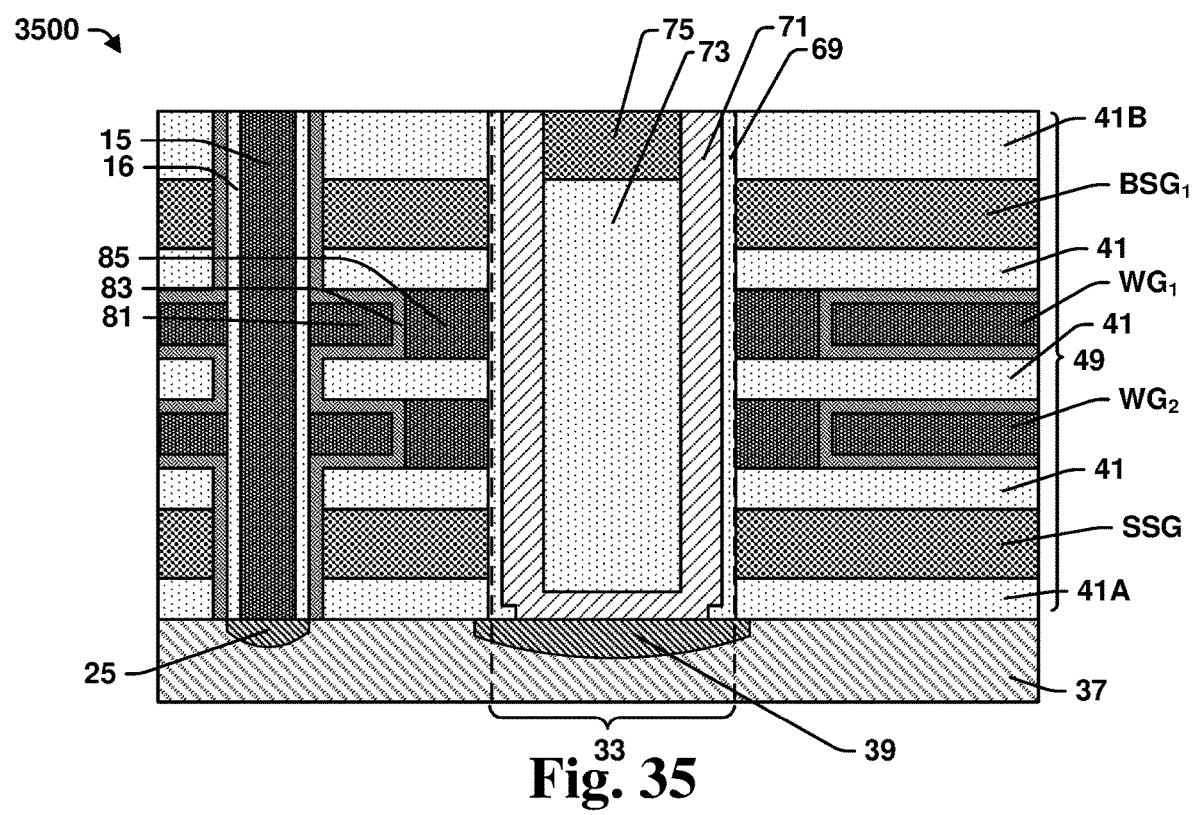

As shown by the cross-sectional view 3500 of FIG. 35, a process is carrier out to remove the conductive material 3401 that is above the stack 49. The removal process could be an etch or a planarization process, such as CMP. The conductive material 3501 that remains provides the conductive plug 75 at the top of the channel via 79. Back end of line (BEOL) processing may follow to provide a structure as shown by the cross-sectional view 100 of FIG. 1.

The cross-sectional views 3600 to 4000 of FIGS. 36 to 40 illustrate a variation of the foregoing method that may be used to produce a memory device such as the memory device 1B of FIG. 11B. As shown by the cross-sectional view 3600 of FIG. 36, which may be compared to the cross-sectional view 1900 of FIG. 19, the tunnel dielectric layer 69 is deposited in the channel hole 1501 but formation of the first semiconductor layer 1901 does not immediately follow. Instead, as shown by the cross-sectional view 3700 of FIG. 37, the method proceeds with an etch process that exposes the first heavily doped area 39.

Figure 38:
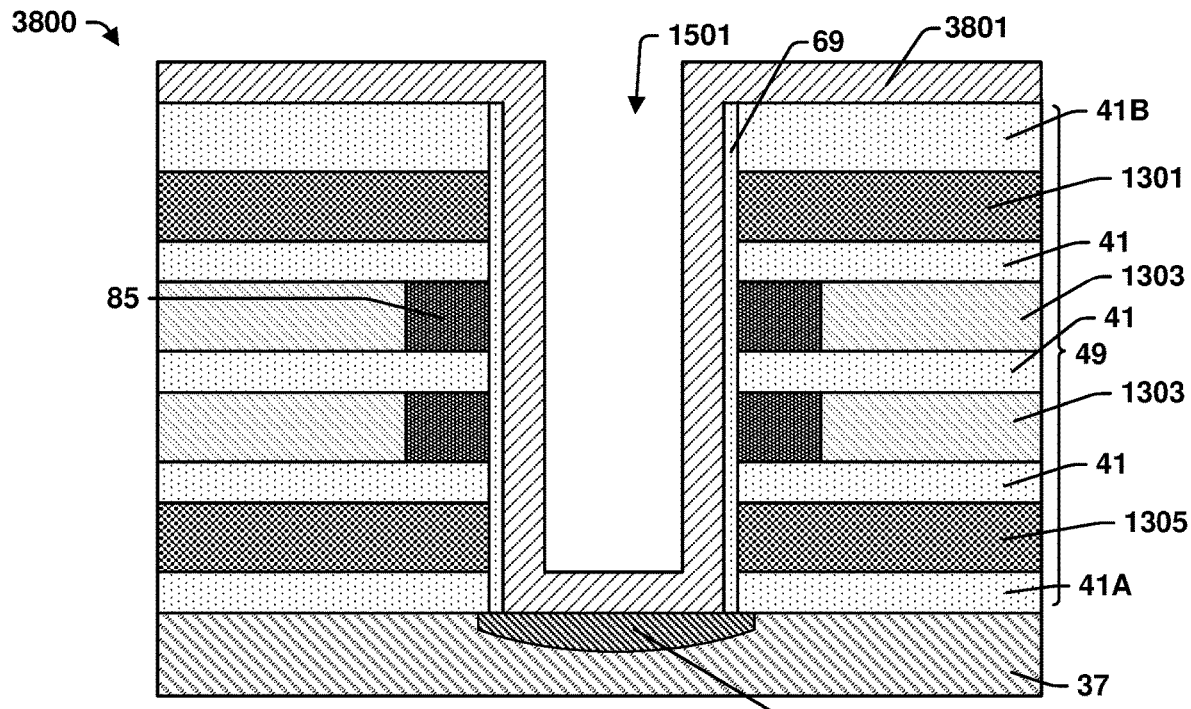

As shown by the cross-sectional view 3800 of FIG. 38, a semiconductor layer 3801 may then be deposited. As shown by the cross-sectional view 3900 of FIG. 39, the dielectric 73 may be deposited to fill the channel hole 1501 followed by a planarization process as shown by the cross-sectional view 4000 of FIG. 40 to remove the dielectric 73 and the semiconductor layer 3801 from the top of the stack 49 and define the semiconductor layer 71B from the semiconductor layer 3801.

In the method of FIGS. 12-35, the first semiconductor layer 1901 is deposited before the tunnel dielectric layer 69 is etched from the bottom of the channel hole 1501. That alternative has the advantage that the first semiconductor layer 1901 protects the tunnel dielectric layer 69 from possible etch damage. The method of FIGS. 36-40 has the advantage of fewer processing steps and the resulting structure may provide better communication between the semiconductor layer 71B and the semiconductor substrate 37.

Figure 41A:
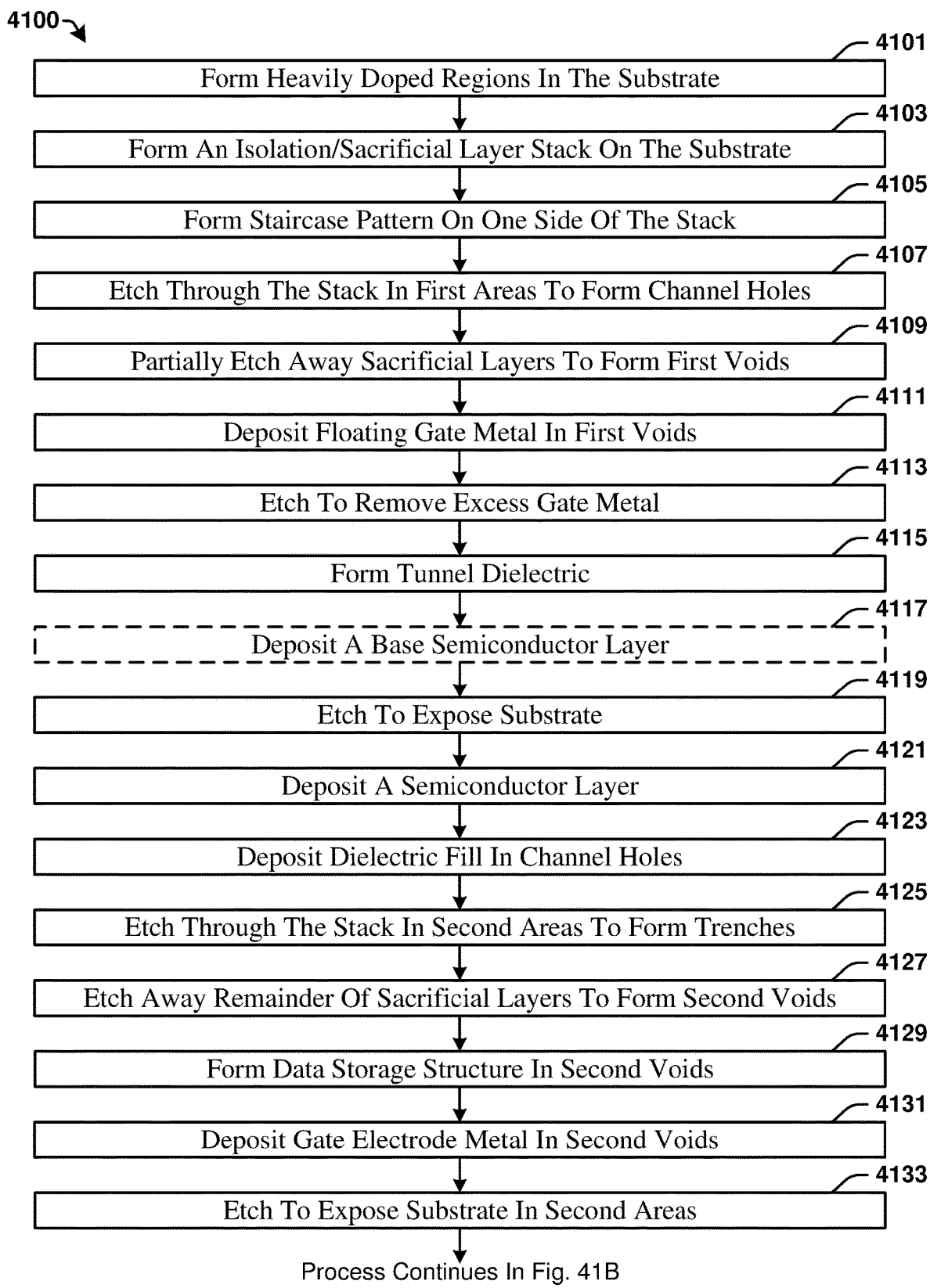
Figure 41B:
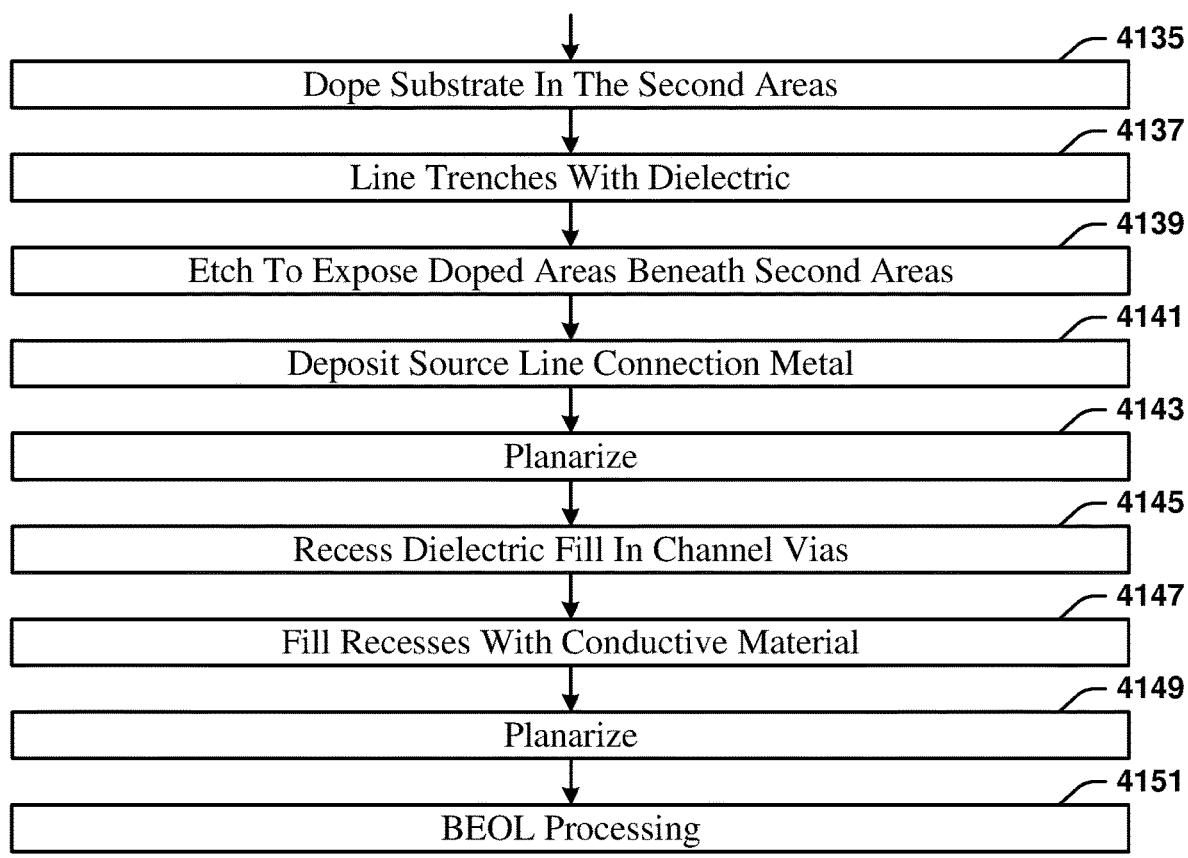

FIGS. 41A and 41B presents a flow chart for a method 4100 that may be used to form a memory device according to the present disclosure. The method 4100 includes steps for forming the memory device 1 of FIG. 1 but may be used to form other memory devices. While the method 4100 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The method 4100 may begin with act 4101, forming heavily doped regions in the semiconductor substrate. The cross-sectional view 1200 of FIG. 12 provides an example. The memory device may be displaced above the substrate to be within the metal interconnect and different structures from the ones shown in the illustrated examples may be used to provide the source line connections, however, the heavily doped regions in the semiconductor substrate are still desirable to ensure a sufficient carrier source to achieve satisfactory erase speed.

The method may continue with act 4103, forming a stack that including sacrificial layers interleaved with isolation layers. The cross-sectional view 1300 of FIG. 13 provides an example. The number of sacrificial layers is at least equal to the number of tiers of memory cells desired in the resulting device. The stack may also include a conductive layer to provide an SSG and/or a conductive layer to provide a BSG. Another option is to include an additional sacrificial layer to provide an SSG and/or an additional sacrificial layer to provide a BSG.

The method may continue with act 4105, forming a staircase pattern on one side of the stack. The cross-sectional view 1400 of FIG. 14A provides an example.

The method may continue with act 4107, forming channel holes in the stack. The cross-sectional view 1500 of FIG. 15 provides an example. The channel holes provide first stack sidewalls.

The method may continue with act 4109, etching through the channel holes and the first stack sidewalls to remove first portions of the sacrificial layer and create first voids. The cross-sectional view 1600 of FIG. 16 provides an example.

The method may continue with act 4111, depositing a first conductive material within the first voids. The cross-sectional view 1700 of FIG. 17 provides an example. Optionally, one or more layers of a data storage structure may be deposited so as to line the first voids prior to filling the first voids with the first conductive material.

The method may continue with act 4113, etching to remove that portion of the first conductive material that deposited outside the first voids. The cross-sectional view 1800 of FIG. 18 provides an example. The remaining material provides the floating gates.

Figure 36:
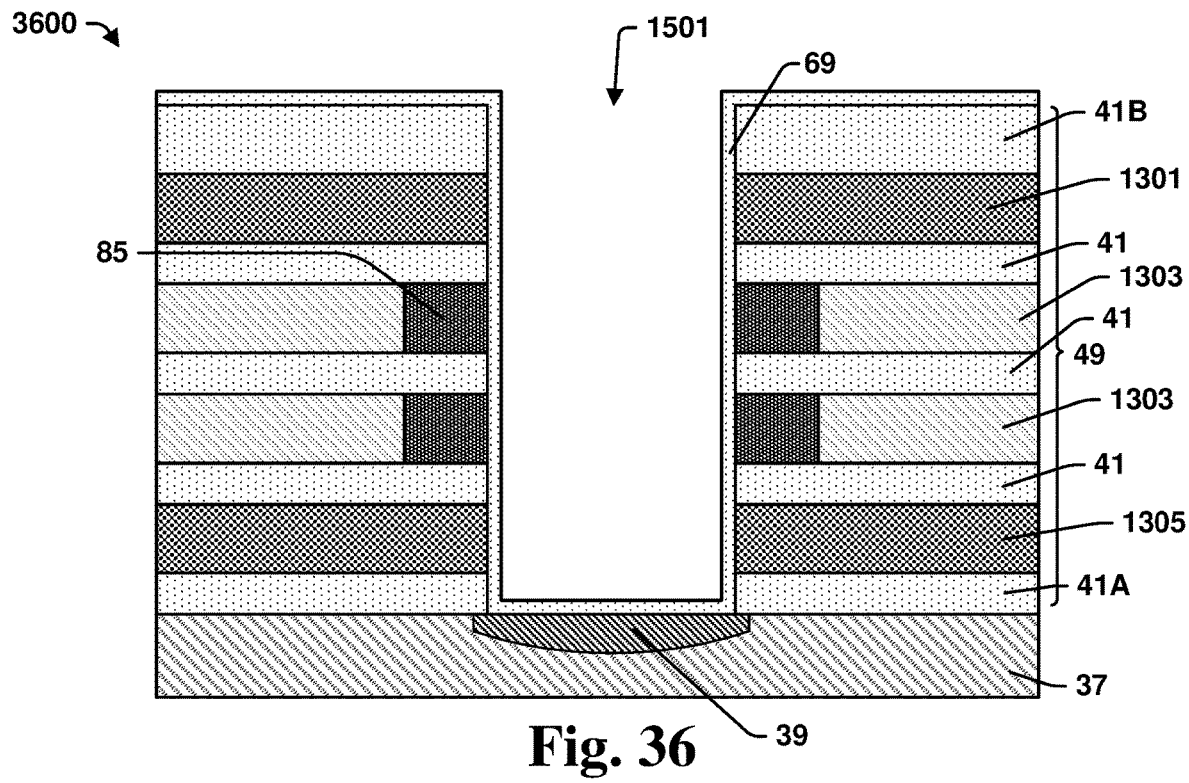
FIGS. 36-40 are a series of cross-sectional view illustrating a variation on the method of FIGS. 12-25 in accordance with some other embodiments of the present disclosure FIGS. 41A and 41B provide a flow chart for a method of forming a memory device in accordance with some aspects of the present disclosure.

The method may continue with act 4115, forming the tunnel dielectric. The cross-sectional views 1900 of FIG. 19 and 3600 of FIG. 36 provide examples. In some embodiments, the tunnel dielectric is deposited so as to line the channel holes. In some embodiments it may be possible to form some or all of the tunnel dielectric by partial oxidation of the floating gates.

The method may continue with act 4117, forming a first semiconductor layer. The cross-sectional view 2000 of FIG. 20 provides an example. Act 4117 is optional.

Figure 37:
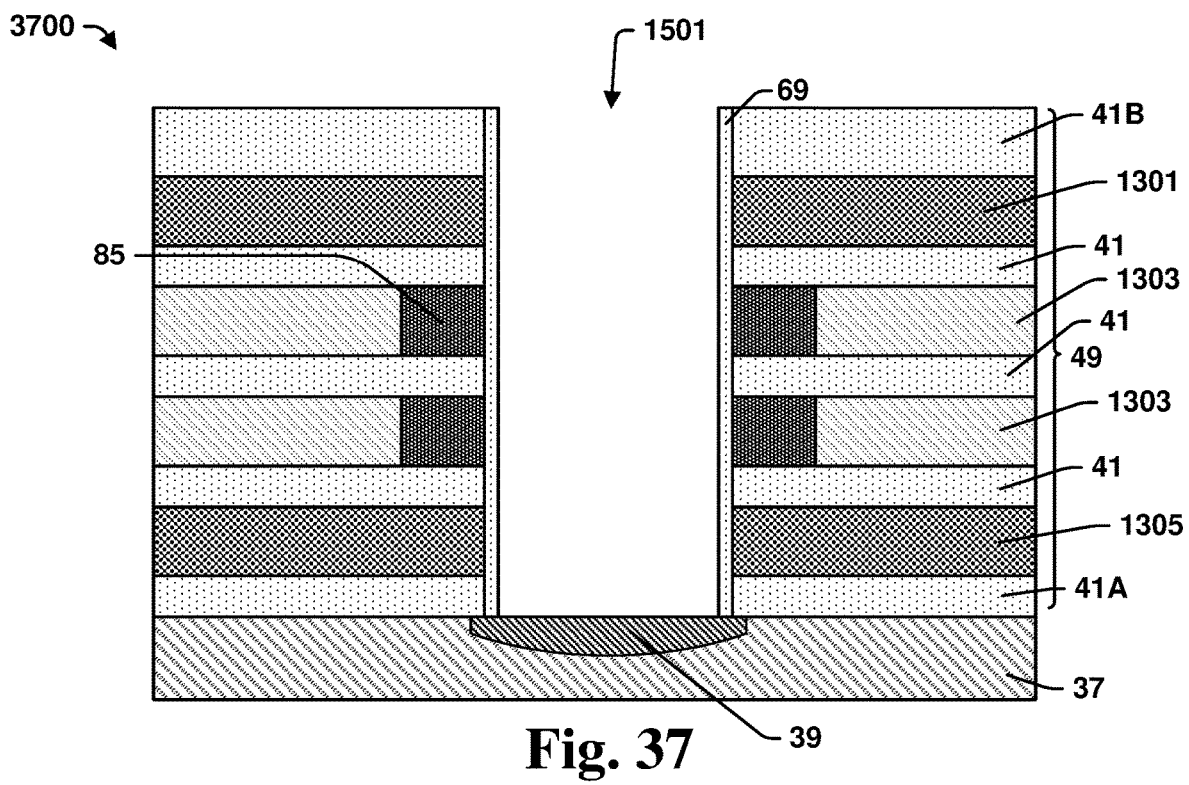

The method may continue with act 4119, etching to expose the substrate through the channel holes. The cross-sectional view 2000 of FIG. 20 provides an example for the case where act 4117 is employed to provide the first semiconductor layer to protect the tunnel dielectric during this etch. The cross-sectional view 3700 of FIG. 37 provides an example for the case where act 4117 is not employed.

The method may continue with act 4121, completing deposition of the semiconductor layer. The cross-sectional view 2100 of FIG. 21 provides an example for the case where a first portion of the semiconductor layer is formed with act 4117. The cross-sectional view 3800 of FIG. 38 provides an example for the case where the semiconductor layer is deposited in a single step.

Figure 39:
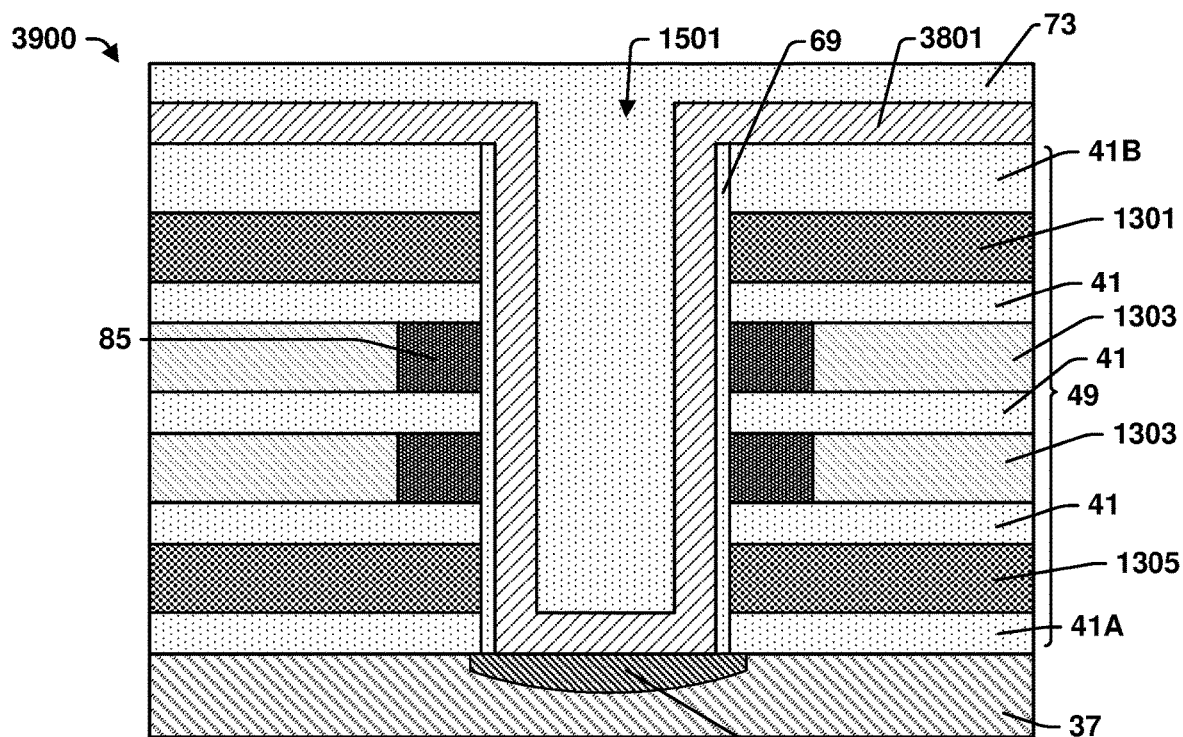
Figure 40:
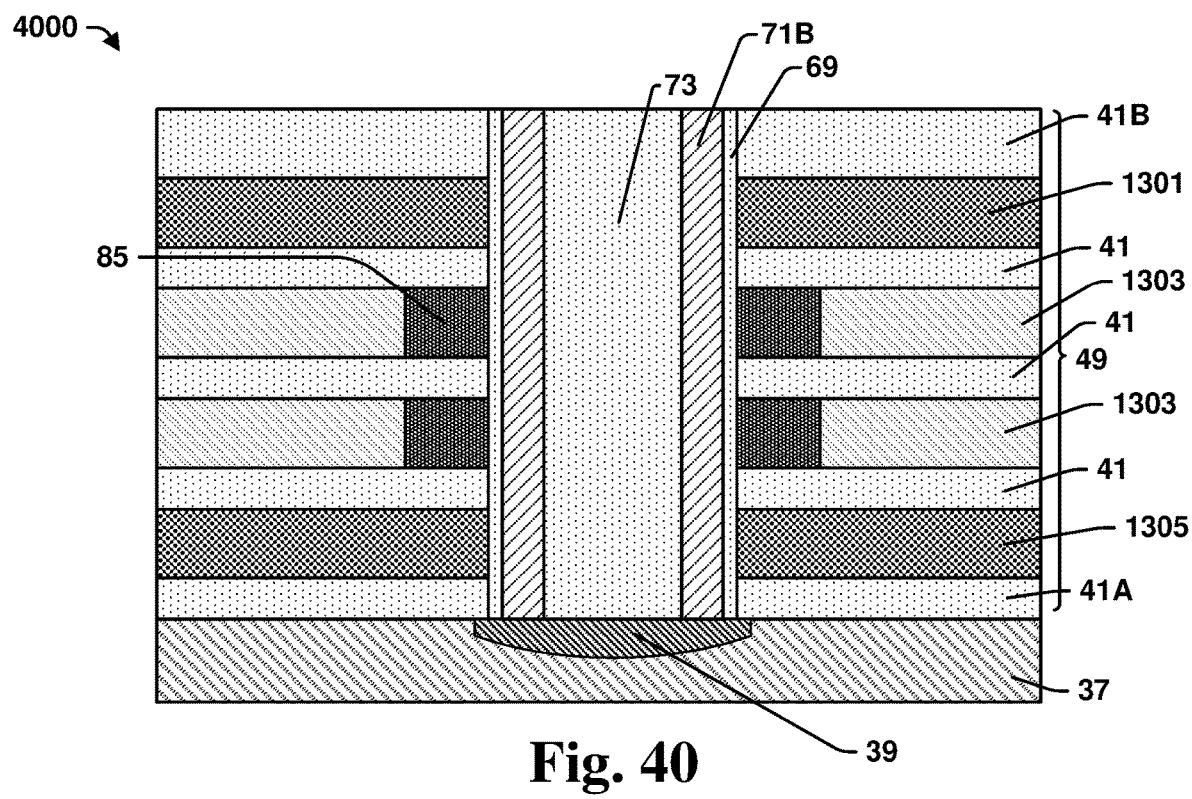

The method may continue with act 4123, filling the channel holes with dielectric. The cross-sectional views 2200 of FIG. 22 and 3900 of FIG. 39 provide examples.

The method may continue with act 4125, etching through the stack in second areas to form trenches. The cross-sectional view 2300 of FIG. 23 provides an example. The trenches provide second stack sidewalls.

The method may continue with act 4127, etching though the trenches and the second stack sidewalls to remove a remainder of the sacrificial layer and create second voids. The cross-sectional view 2400 of FIG. 24 provides an example.

The method may continue with act 4129, forming a data storage layer in the second voids. The cross-sectional view 2500 of FIG. 25 provides an example. The data storage layer provides a data storage structure. The data storage structure may include a plurality of distinct layers. Some layers of the data storage structure may be provided by deposition in the first voids.

The method may continue with act 4131, depositing a second conductive material within the second voids. The cross-sectional view 2600 of FIG. 26 provides an example.

The method may continue with act 4133, etching to expose the substrate in the trenches. The cross-sectional view 2700 of FIG. 27 provides an example. This etching may also remove an excess portion of the second conductive material deposited with act 4131.

The method may continue with act 4135, doping the substrate in the second areas through the trenches. The cross-sectional view 2800 of FIG. 28 provides an example.

The method may continue with act 4137, lining the trenches with dielectric. The cross-sectional view 2900 of FIG. 29 provides an example.

The method may continue with act 4139, etching to expose the substrate in the trenches. The cross-sectional view 3000 of FIG. 30 provides an example.

The method may continue with act 4141, depositing a conductive material in the trenches to form source line connections. The cross-sectional view 3100 of FIG. 31 provides an example.

The method may continue with act 4143, planarizing to remove excess conductive material from the stack. The cross-sectional view 3200 of FIG. 32 provides an example.

The method may continue with act 4145, etching to recess the dielectric in the channel vias. The cross-sectional view 3300 of FIG. 33 provides an example.

The method may continue with act 4147, filling the recess in the channel vias with conductive material to form conductive plugs. The cross-sectional view 3400 of FIG. 34 provides an example.

The method may continue with act 4149, planarizing to remove excess conductive material from the stack. The cross-sectional view 3500 of FIG. 35 provides an example. It will be appreciated that one or more of act 4145 to act 4149 may be performed earlier in the process and some of these acts may be combined with other acts.

The method may continue with act 4151, BEOL processing. BEOL processing produces metal interconnect structures such as the ones illustrated by the cross-sectional view 100 of FIG. 1.

Some aspects of the present disclosure provide a memory device that includes a stack with one or more memory cell layers. A plurality of channel vias extend vertically through the stack from a first end to a second end. Each of the channel vias includes a semiconductor layer. A source line couples to the semiconductor layers through the first end. Bit lines couple to the semiconductor layers through the second ends. Each of the memory cell layers includes a word line gate, a plurality of floating gates, and a data storage layer. Each of the floating gates encircles a distinct channel column and is separated from the channel column by a tunnel dielectric layer. The data storage layer is disposed between the word line gate and each of the plurality of floating gates. In some embodiments, the stack includes a plurality of memory cell layers. In some embodiments, the data storage layer is a ferroelectric layer. In some embodiments, the memory cells are MFMIS memory cells. In some embodiments, the stack is formed on a semiconductor substrate. In some embodiments the source line couples to the semiconductor layers through heavily doped regions of the semiconductor substrate.

In some embodiments, the stack includes a bit line-connection select gate layer between memory cell layers and the second ends. The bit line-connection select gate layer includes a bit line-connection select gate that extends around each of the channel vias. A tunnel dielectric is disposed between the channel vias and the bit line-connection select gate. In some embodiments, the bit line-connection select gate comprises polysilicon. In some embodiments, the bit line-connection select gate has the MFM structure of the memory cell layers.

In some embodiments, the stack includes a source line-connection select gate layer between memory cell layers and the semiconductor substrate. The source line-connection select gate layer includes a source line-connection select gate that extends around each of the channel vias. A tunnel dielectric is disposed between the channel vias and the source line-connection select gate. In some embodiments, the source line-connection select gate comprises polysilicon. In some embodiments, the source line-connection select gate has the MFM structure of the memory cell layers.

Some aspects of the present disclosure provide a memory device having memory cell layers interleaved with isolation layers, each memory cell layer including a stack area and a plurality of via regions. Dielectrics of the isolation layers sandwich the memory cell layers in the stack areas. The memory device has MFMIS memory cells that include a gate electrode, a ferroelectric layer, a floating gate, a tunnel dielectric, and a semiconductor channel. The gate electrodes, the ferroelectric layers, and the floating gates are in the stack area. The semiconductors channels are provided by semiconductor structures that extend vertically through the memory cell layers and the isolation layers in the via regions. The tunnel dielectrics are disposed between the floating gates and the semiconductor channels. In some embodiments the ferroelectric layers extend above and below the gate electrodes within the stack area. In some embodiments, the gate electrodes in each memory cell layer are united into a single word line gate. In some embodiment, the gate electrodes and the floating gates are metal.

Some aspects of the present disclosure relate to a method of forming a memory device. The method includes forming a stack having alternating insulating layers and sacrificial layers, etching through the stack in first areas to form first stack sidewalls, etching from the first stack sidewalls to remove first portions of the sacrificial layer and create first voids, depositing a first conductive material within the first voids, forming a tunnel dielectric, forming a channel layer in the first areas, etching through the stack in second areas to form second stack sidewalls, etching though the second stack sidewalls to remove a remainder of the sacrificial layer and create second voids, forming a data storage layer within the second voids, and depositing a second conductive material within the second voids. In some embodiments, the first areas are circular in cross-section. In some embodiments, etching through the stack in the second areas forms trenches in the stack. In some embodiments, the tunnel dielectric lines the first edges. In some embodiments, the method further includes filling the first areas with dielectric, etching the dielectric to create recesses in the first areas, and depositing a conductive material in the recesses to form conductive plugs that contact the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a stack comprising alternating insulating layers and sacrificial layers over a semiconductor substrate;
etching first holes in the stack;
etching through the first holes to remove first portions of the sacrificial layer, creating first voids;
depositing a first conductive material within the first voids;
forming a tunnel dielectric;
forming a semiconductor layer in the first holes;
filling the first holes with a second dielectric;
forming a mask over the stack, wherein the mask has first openings and second openings;
etching through the mask to form trenches corresponding to the first openings and second holes corresponding to the second openings;
etching though the trenches and the second holes to remove a remaining portion of the sacrificial layers and create second voids, wherein the second voids extend laterally from the trenches;
forming a data storage layer within the second voids; and
depositing a second conductive material within the second voids.

2. The method of claim 1, wherein the data storage layer is a ferroelectric layer.

3. The method of claim 1, wherein the first holes are circular in cross-section.

4. The method of claim 1, further comprising:
lining the trenches with a third dielectric;
doping the semiconductor substrate through the trenches; and
depositing a third conductive material in the trenches, wherein the third dielectric prevents the third conductive material from contacting the second conductive material.

5. The method of claim 1, further comprising doping the semiconductor substrate to form a plurality of heavily doped areas corresponding to the first holes prior to forming the stack.

6. The method of claim 1, wherein the first holes together with the second holes form a pattern of evenly spaced holes between an adjacent pair of the trenches.

7. A method, comprising:
forming a stack comprising a plurality of sacrificial layers interleaved with dielectric layers, and a polysilicon layer above or below the plurality of sacrificial layers;
etching first openings through the stack;
etching through the first openings to remove first portions of the plurality of sacrificial layers so as to create first voids;
depositing a first conductive material within the first voids;
etching so as to remove a portion of the first conductive material that is outside the first voids;
lining the first openings with a gate dielectric;
forming a semiconductor layer in the first openings over the gate dielectric;
etching second openings through the stack;
etching through the second openings to remove second portions of the plurality of sacrificial layers so as to create second voids;
lining the second voids with a data storage structure; and depositing a second conductive material within the second voids;

wherein the resulting structure provides a vertical stack of series connected transistors in which;

the sacrificial layers are replaced by second conductive material-data storage structure-first conductive material composites which, together with the gate dielectric and the semiconductor layer, provide transistors with a threshold voltage that varies according to a programmable state of the data storage structure; and the polysilicon layer together with the gate dielectric and the semiconductor layer provides a transistor with a fixed threshold voltage.

8. The method of claim 7, wherein the polysilicon layer is below the plurality of sacrificial layers.

9. The method of claim 7, wherein the first conductive material fills the first voids.

10. The method of claim 9, wherein the first conductive material comprises tungsten, aluminum, copper, titanium, tantalum, nickel, polysilicon, or graphene.

11. A method, comprising:

forming a stack by depositing alternating layers of a first material and a second material, wherein each layer of the second material is disposed between two layers of the first material;

etching first openings through the stack;

removing a first portion of the layers of the second material through the first openings to create first voids;

depositing a first conductive material into the first voids to form floating gates;

lining the first openings with a tunnel dielectric and a semiconductor material, wherein the tunnel dielectric separates the semiconductor material from the floating gates;

etching trenches through the stack;

removing a second portions of the layers of the second material to create second voids extending laterally from the trenches; and depositing a ferroelectric material and a second conductive material into the second voids, wherein the resulting structure forms vertical stacks of series-connected metal-ferroelectric-metal-insulator-semiconductor field-effect transistors (MFMIS-FETs) in which:

the second conductive material provides gate electrodes;

the ferroelectric material separates the gate electrodes from the floating gates; and the semiconductor material provides channels; and the floating gates, ferroelectric material, and gate electrodes are radially distributed around the channels.

12. The method of claim 11, wherein the first conductive material comprises tungsten, aluminum, copper, titanium, tantalum, or nickel.

13. The method of claim 11, wherein the first conductive material comprises titanium nitride (TiN), tantalum nitride (TaN), or tantalum aluminum nitride (TaAlN).

14. The method of claim 11, wherein the first conductive material comprises polysilicon or graphene.

15. The method of claim 11, wherein the floating gates have a width of at least 100 Angstroms.

16. The method of claim 1, wherein the first conductive material comprises tungsten, aluminum, copper, titanium, tantalum, or nickel.

17. The method of claim 1, wherein the first conductive material comprises titanium nitride (TiN), tantalum nitride (TaN), or tantalum aluminum nitride (TaAlN).

18. The method of claim 1, wherein the first conductive material is polysilicon or graphene.

19. The method of claim 1, wherein the first voids extend laterally at least 100 Angstroms from the first holes.

20. The method of claim 1, wherein:

the stack further comprises a polysilicon layer; and the polysilicon layer provides a gate electrode for an access control transistor for a string of memory cells; and each of the memory cells in the string is a metal-ferroelectric-metal-insulator-semiconductor field-effect transistor (MFMIS-FETs) in which:

the first conductive material provides a floating gate;

the second conductive material provides a gate electrode;

the data storage layer comprises a ferroelectric material disposed between the gate electrode and the floating gate;

the semiconductor layer provides a channel; and the tunnel dielectric is between the channel and the floating gate.

* * * * *